United States Patent
Nagasaka et al.

(10) Patent No.: US 6,857,107 B2
(45) Date of Patent: Feb. 15, 2005

(54) LSI LAYOUT METHOD AND APPARATUS FOR CELL ARRANGEMENT IN WHICH TIMING IS PRIORITIZED

(75) Inventors: Mitsuaki Nagasaka, Kawasaki (JP); Daisuke Miura, Kawasaki (JP); Masayuki Okamoto, Kawaskai (JP); Hiroyuki Honda, Kawasaki (JP); Toshio Arakawa, Kawasaki (JP); Shuji Yoshida, Kawasaki (JP); Kenji Yoshida, Kawasaki (JP); Kenji Kobayashi, Nagoya (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 10/079,545

(22) Filed: Feb. 22, 2002

(65) Prior Publication Data

US 2003/0023938 A1 Jan. 30, 2003

(30) Foreign Application Priority Data

Jul. 27, 2001 (JP) ........................................ 2001-228373

(51) Int. Cl.$^7$ ............................................. G06F 17/50
(52) U.S. Cl. ..................... 716/2; 716/6; 716/7; 716/8; 716/9; 716/10; 716/13; 716/14
(58) Field of Search ............................... 716/2, 5, 6, 7, 716/8–14, 16, 17, 18, 4, 1, 19; 714/733, 33; 713/1; 703/6, 9, 25, 28; 365/51, 69, 150; 327/292; 326/40, 41; 257/773, 296, 382, 767, 774, 295; 235/487

(56) References Cited

U.S. PATENT DOCUMENTS

| | | | | |
|---|---|---|---|---|
| 5,917,729 A | * | 6/1999 | Naganuma et al. | 716/10 |
| 6,415,426 B1 | * | 7/2002 | Chang et al. | 716/9 |
| 6,530,073 B2 | * | 3/2003 | Morgan | 716/18 |

OTHER PUBLICATIONS

Mayrhofer et al., "Congestion_Driven Placement Using a New Multi–Partitioning Heuristic", Nov. 1990, Computer–Aided Design, . ICCAD–90. Digest of Technical Papers., IEEE International Conference, pp. 332–335.*

* cited by examiner

Primary Examiner—Vuthe Siek
Assistant Examiner—Helen Rossoshek
(74) Attorney, Agent, or Firm—Staas & Halsey LLP

(57) ABSTRACT

In a layout method for an LSI having a plurality of cells, automated arrangement of cells is performed on the basis of a netlist, which has cells and connection data therefor, and timing conditions, and, once a timing optimization processing is performed so that a plurality of cells are arranged on a chip, global wiring processing is implemented and the wiring congestion rate is analyzed. In addition, in small regions where a wiring congestion rate is so high that detailed wiring processing is judged to be difficult, cell rearrangement processing is implemented. Next, detailed wiring processing is performed with respect to the cells which have been rearranged. The rearrangement of cells is performed only in small regions with a high congestion rate, with the result that the overall cell arrangement in which timing is optimized is not changed markedly, whereby it is possible to reduce the probability of wiring being impossible in the course of the detailed wiring processing.

17 Claims, 16 Drawing Sheets

CELL ARRANGEMENT BEFORE RE-ARRANGEMENT

DIVIDED SMALL REGIONS

CELL ARRANGEMENT AFTER RE-ARRANGEMENT

FIG. 6   DETAILED WIRING PROGRAM
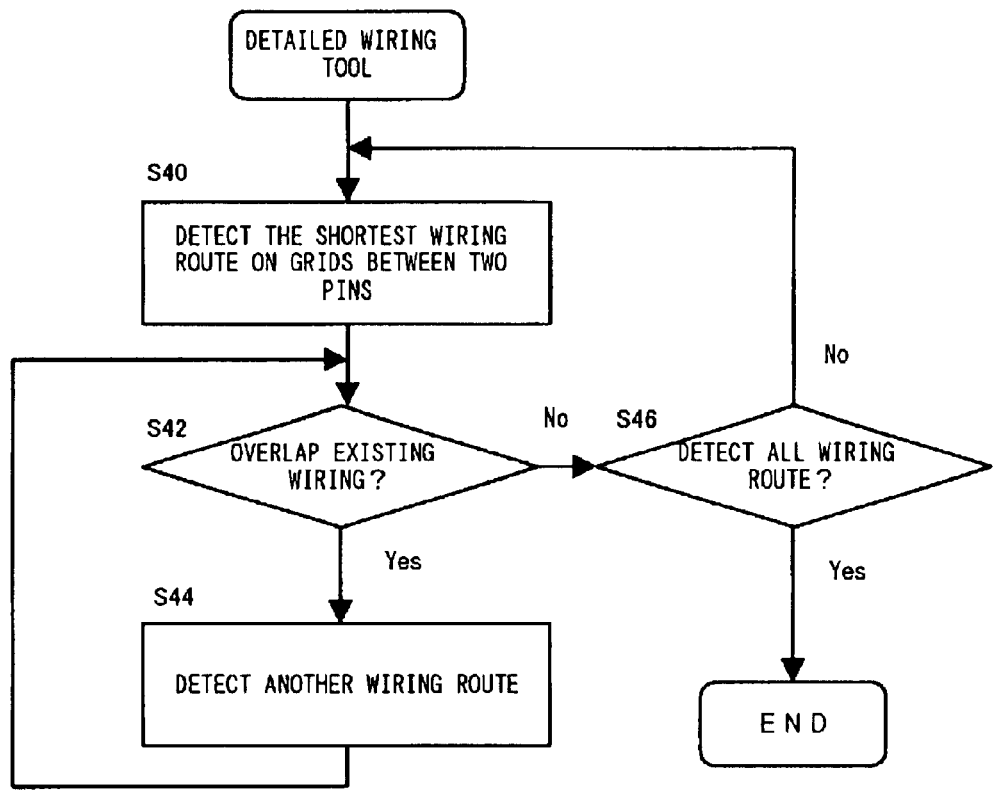

FIG. 7A  GLOBAL WIRING TOOL
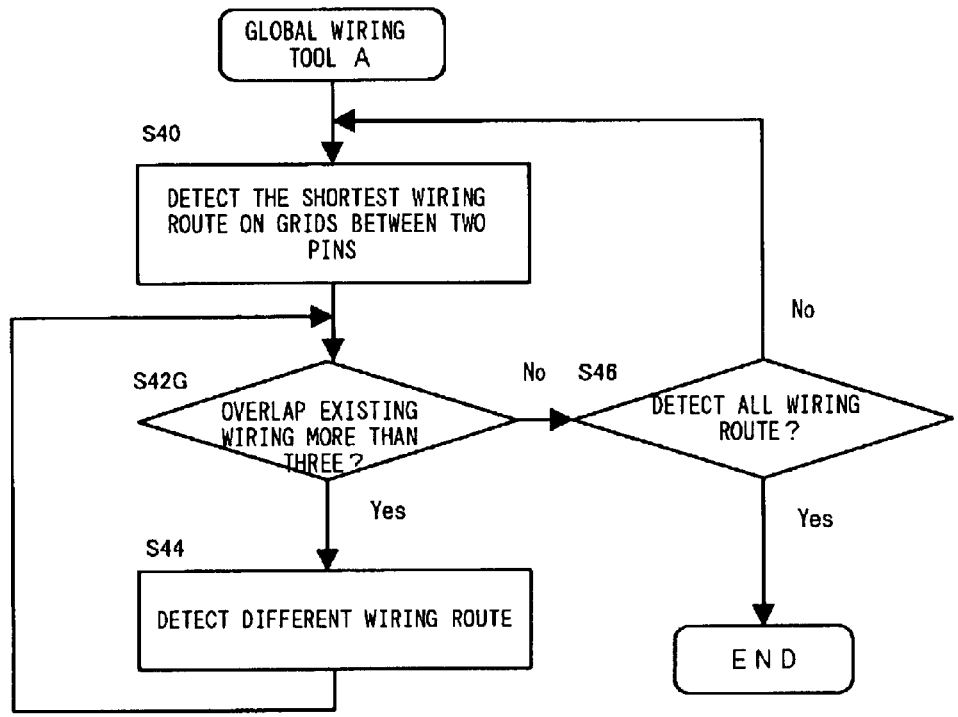
FIG. 7B
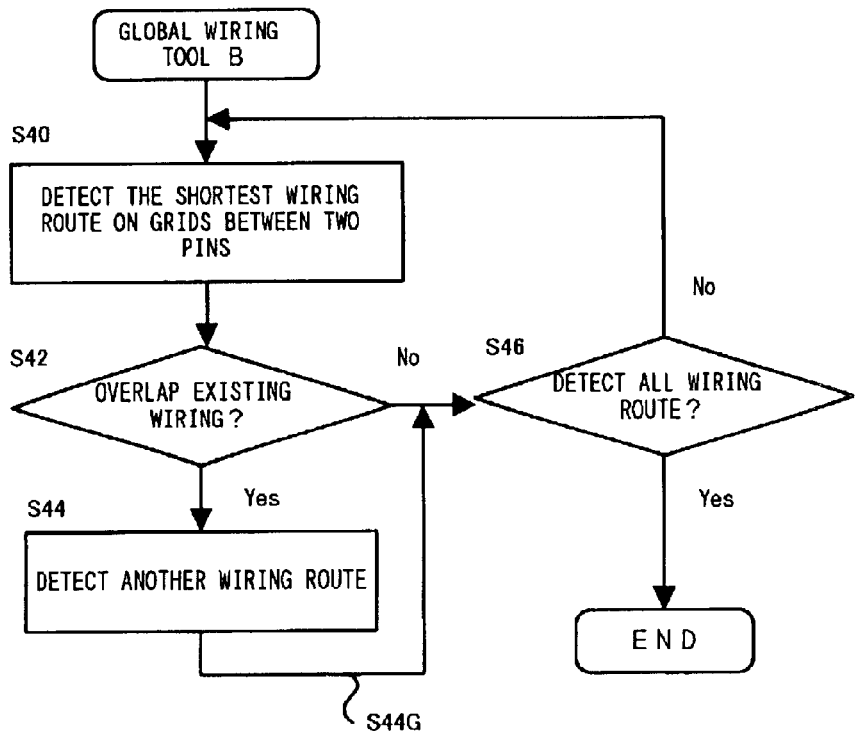

CLOCK TREE GENERATION EXAMPLE

FIG. 9A     IN-PLACE OPTIMIZATION
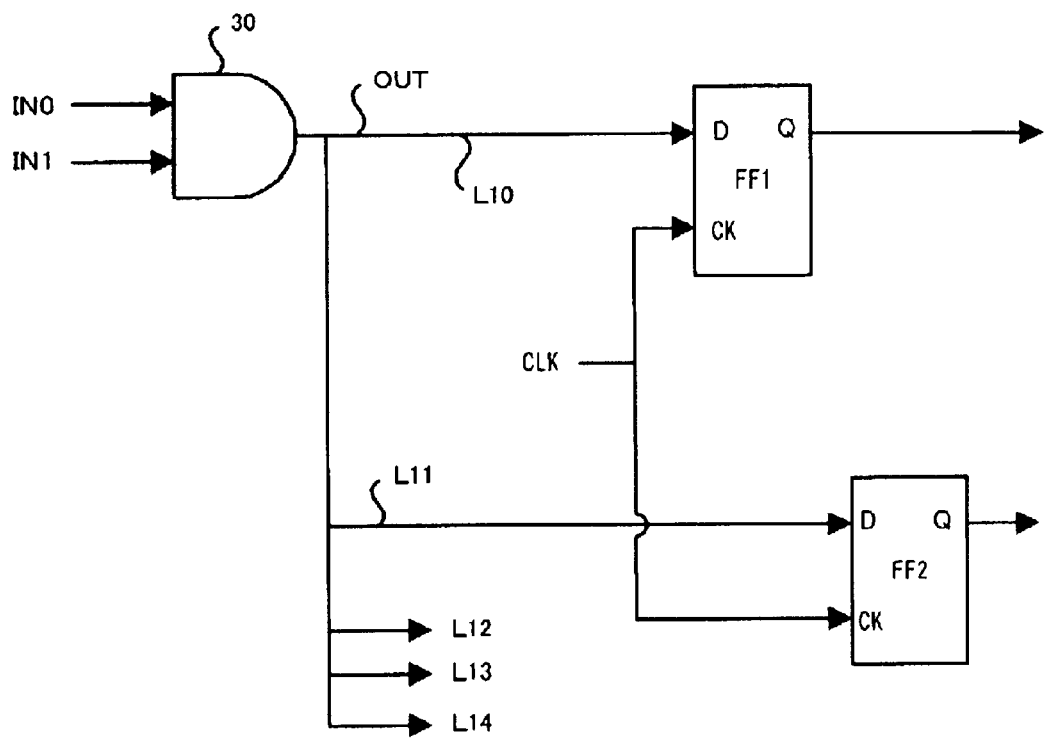
FIG. 9B
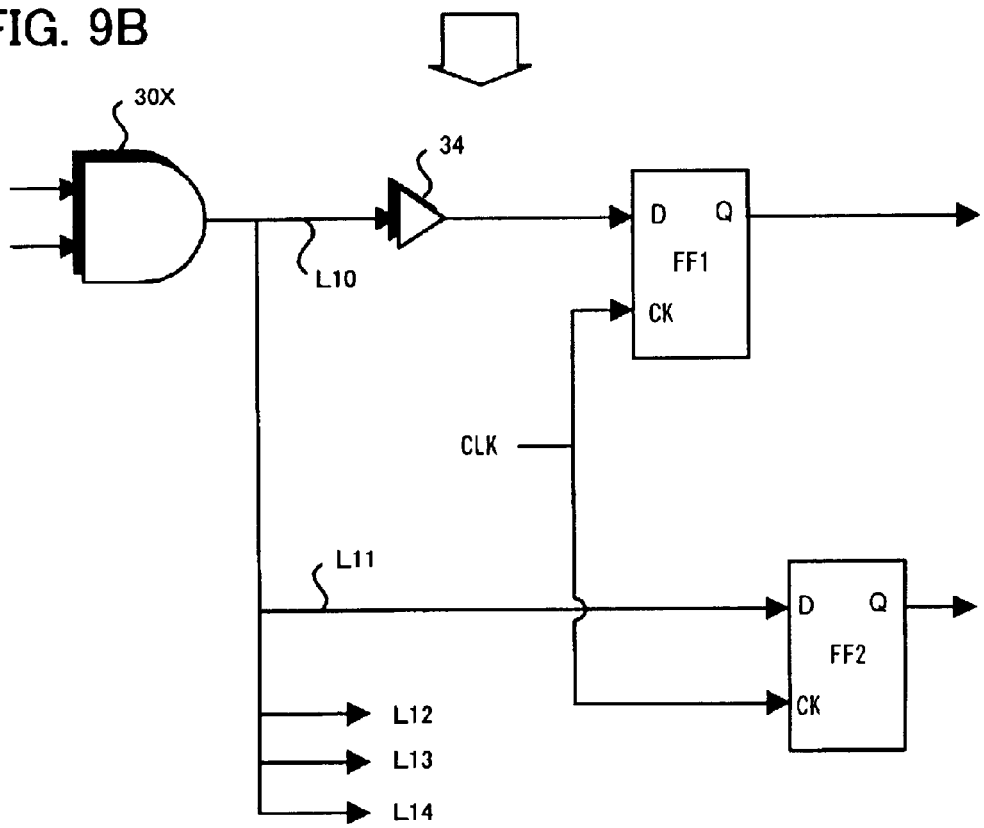

FIG. 15A
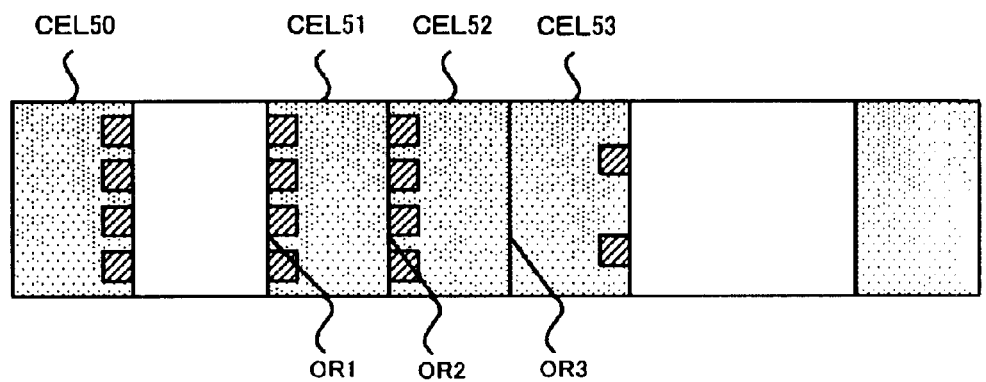
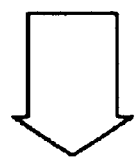
FIG. 15B
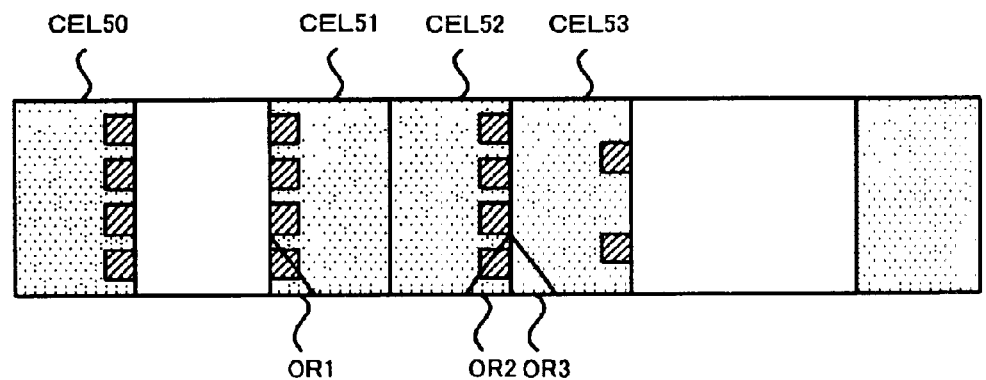

FIG. 16A
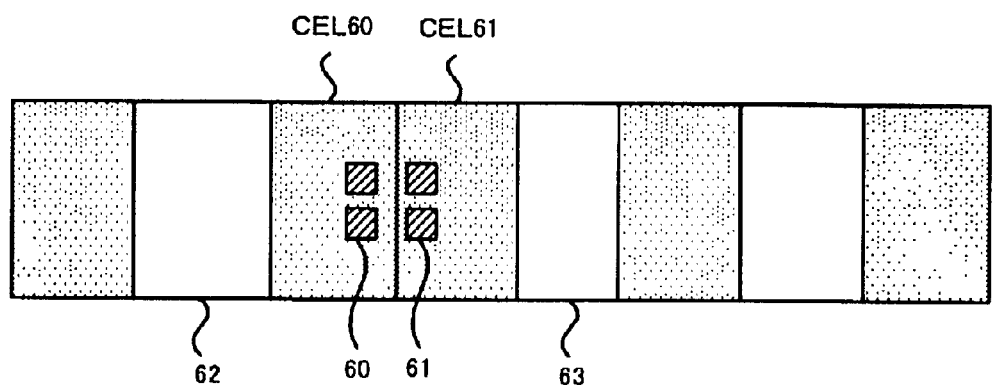
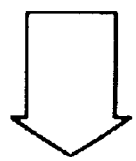
FIG. 16A
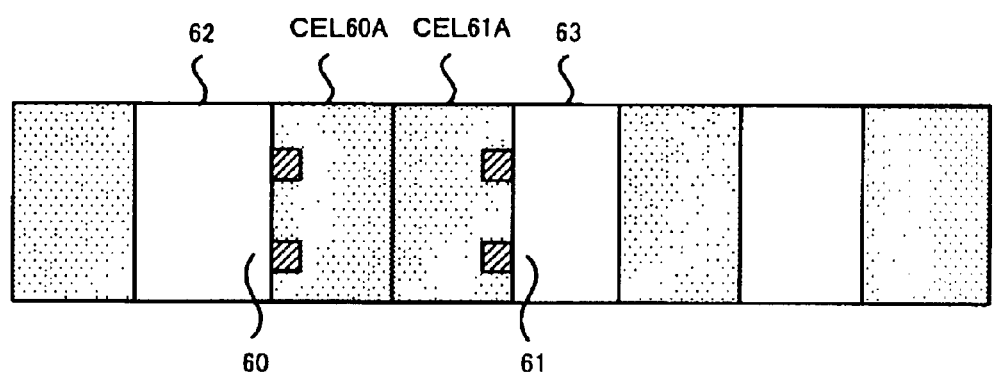

LSI LAYOUT METHOD AND APPARATUS FOR CELL ARRANGEMENT IN WHICH TIMING IS PRIORITIZED

BACKGROUND OF THE INVENTION

1. Field of the Invention

The present invention relates to a layout method and apparatus for integrated circuits (hereinafter, "LSI"), and more particularly to an LSI layout method and layout apparatus, for performing cell arrangement, in which timing is prioritized, and for generating wiring between cells.

2. Description of the Related Art

LSI design is typically conducted using a computer. Particularly in the case of an ASIC (Application Specific Integrated Circuit), which is a semicustom LSI, logic design is conducted for LSIs that are to exhibit target functions, and the layout of the LSI is carried out on the basis of this logic design data. In logic design, essential basic cells are selected from a cell library stored beforehand, whereby a logic circuit is designed to implement the target functions. As a result, logic data (a so-called "net list") is generated that has a plurality of cells and connections between input/output terminals of these cells. In accordance with this netlist, a layout step is performed for the arrangement of cells on a chip and the generation of connection wiring between these cells.

Upon completion of the layout step, a signal propagation delay time is calculated from the cell drive capability, and the connection wiring resistance, capacitance and inductance, for example, and, by referencing the netlist and delay time, logic simulation is performed. If the result of the logic simulation is a pass, the generation of the actual layout data and the generation of pattern data follow, and then data required for an LSI preliminary step is generated.

An increase in the speeds of LSIs in recent years has been accompanied by the implementation of cell arrangement processing that takes into account signal and clock timing, and optimization processing to optimize the timing of signals and clocks. Particularly in cell automated arrangement processing on the basis of a netlist, an order of priority is determined in which cells are ordered according to an increasing strictness in the timing of input signals and clocks, and the automated arrangement of cells is performed in accordance with this order of priority.

However, due to the great importance placed on the timing of signals and clocks in the arrangement of cells, localized dense regions of cells are sometimes formed on the chip. In other words, a lot of cells are sometimes arranged in regions close to input signal terminals and clock input terminals. As a result, in an automated wiring step, which follows the automated cell arrangement step, on account of the congestion of wiring in these dense regions, there have been frequent cases in which it becomes impossible to generate wiring in these regions. When wiring becomes impossible in the automated wiring step, it is necessary to repeat the automated cell arrangement processing and automated wiring processing, after changing timing conditions or other conditions.

Gate numbers in ASICs of recent years have reached high levels, such that, even when high-speed computers are used, several days are required for the automated cell arrangement processing and automated wiring processing. This means that the above-mentioned repetition of the automated cell arrangement processing and automated wiring processing is not only to be associated with an extension of the ASIC design step and increased costs, but also a loss of the short delivery times that characterize ASICs.

SUMMARY OF THE INVENTION

Additional aspects and/or advantages of the invention will be set forth in part in the description which follows and, in part, will be obvious from the description, or may be learned by practice of the invention.

It is therefore an object of the present invention to provide a layout method and apparatus therefor, which, as far as possible, permit automated wiring after cell arrangement in which timing is prioritized.

In order to resolve the above-mentioned object, according to one aspect of the present invention, in a layout method for an LSI having a plurality of cells, automated arrangement of cells is performed on the basis of a netlist, which has cells and connection data therefor, and timing conditions, and, once a timing optimization processing is performed so that a plurality of cells are arranged on a chip, global wiring processing is implemented and the wiring congestion rate is analyzed. In addition, in small regions where a wiring congestion rate is so high that detailed wiring processing is judged to be difficult, cell rearrangement processing is implemented. Next, detailed wiring processing is performed with respect to the cells which have been rearranged.

According to the above-mentioned invention, the rearrangement of cells is performed only in small regions with a high congestion rate, with the result that the overall cell arrangement in which timing is optimized is not changed markedly, whereby it is possible to reduce the probability of wiring being impossible in the course of the detailed wiring processing. As a result, it is possible to suppress or prevent instances where automated cell arrangement processing and detailed wiring processing, which necessitate long machine times, are performed in vain as has been the case conventionally.

According to a preferred embodiment of the above-mentioned invention, in a case in which, even if cell rearrangement is performed in the small region, the wiring congestion does not fall below a given reference level, cell rearrangement processing is implemented in new small regions produced by enlarging the initial small regions. Then, if the wiring congestion rate is lower than the reference level, detailed wiring processing is performed. By means of this method, since cell rearrangement processing is performed after enlarging small regions, it is possible to perform cell rearrangement processing with greater flexibility.

According to a preferred embodiment of the above-mentioned invention, cell rearrangement processing comprising any of the steps of: (1) enlarging cell arrangement gaps, (2) enlarging cell row gaps, (3) shifting neighboring cells in an upward or downward direction, a leftward or rightward direction, an oblique direction or a rotational direction. (4) changing or inverting the orientation of cells, and (5) substituting with cells with the same logic characteristics and whose terminal positions are different. If such cell rearrangement is performed, there is no variation in the relative positional relationship of cells, and it is thus possible to alleviate the wiring congestion rate without destruction of the optimized timing state.

According to a preferred embodiment of the above-mentioned invention, the wiring congestion rate is determined in accordance with at least one of: the total surface area of cells in the small region, the total number of cell connection pins, the total number of connection wires, and the total number of through wires. Alternatively, in another preferred embodiment, the wiring congestion rate is determined in accordance with a value resulting from dividing the total number of connection wires by the total number of pins in the small regions.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 6 is a flow chart for a detailed wiring program.

FIG. 7 shows flow charts for global wiring programs.

FIG. 9 is a figure to show examples of in-place optimization processing.

FIG. 15 is a figure to illustrate a method of inverting cell direction in cell rearrangement.

FIG. 16 is a figure to illustrate a method of substitution with cells that have the same logic circuit and electrical characteristics and whose terminal positions are different.

DETAILED DESCRIPTION OF THE PREFERRED EMBODIMENTS

Figure 1:
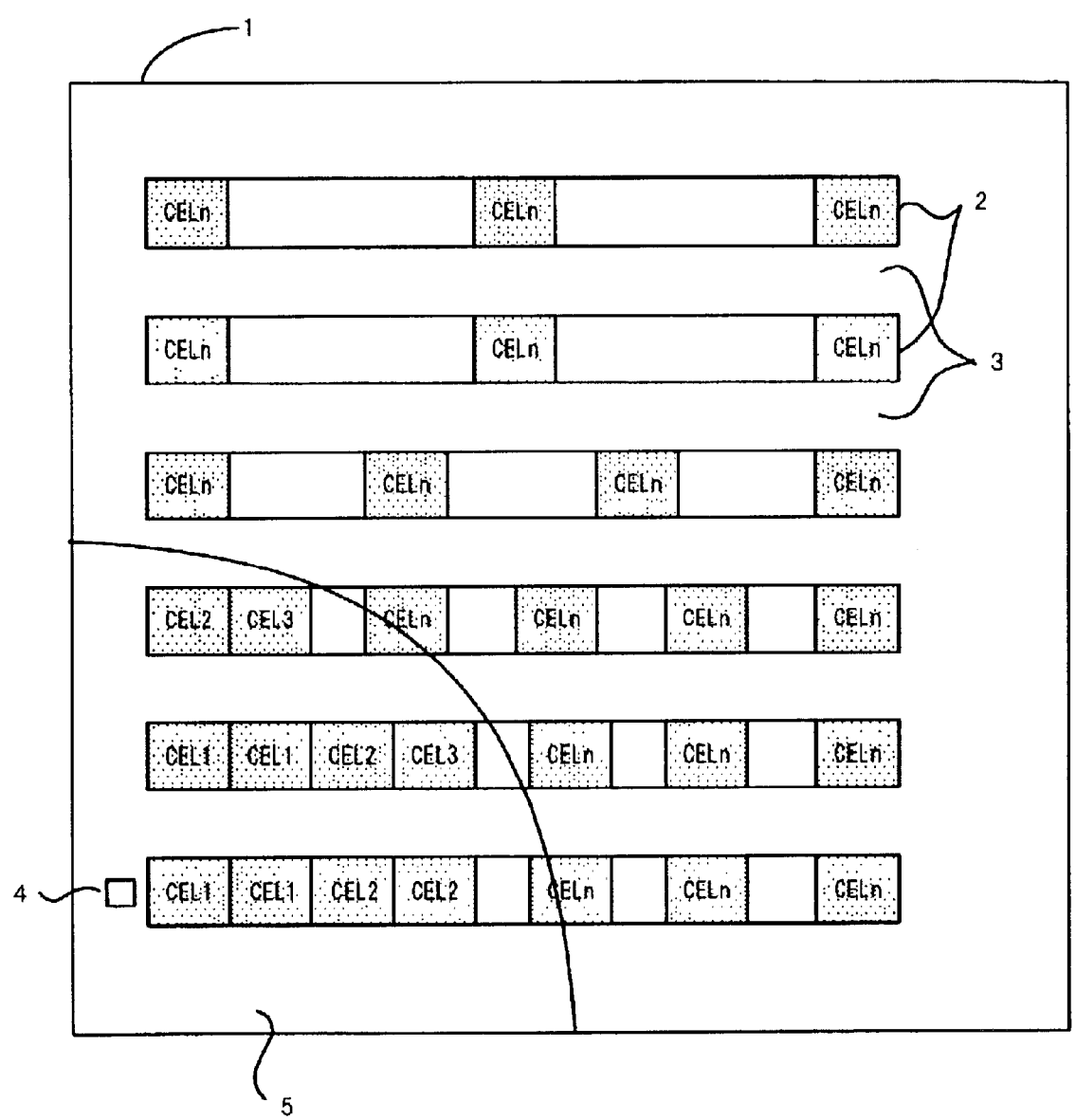
FIG. 1 is a figure to schematically illustrate a layout method for the embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

An embodiment of the present invention will be described hereinbelow by reference to the drawings. However, the scope of protection of the present invention is not limited to the embodiment hereinbelow and includes inventions mentioned in the patent claims and equivalent thereof.

Figure 2:
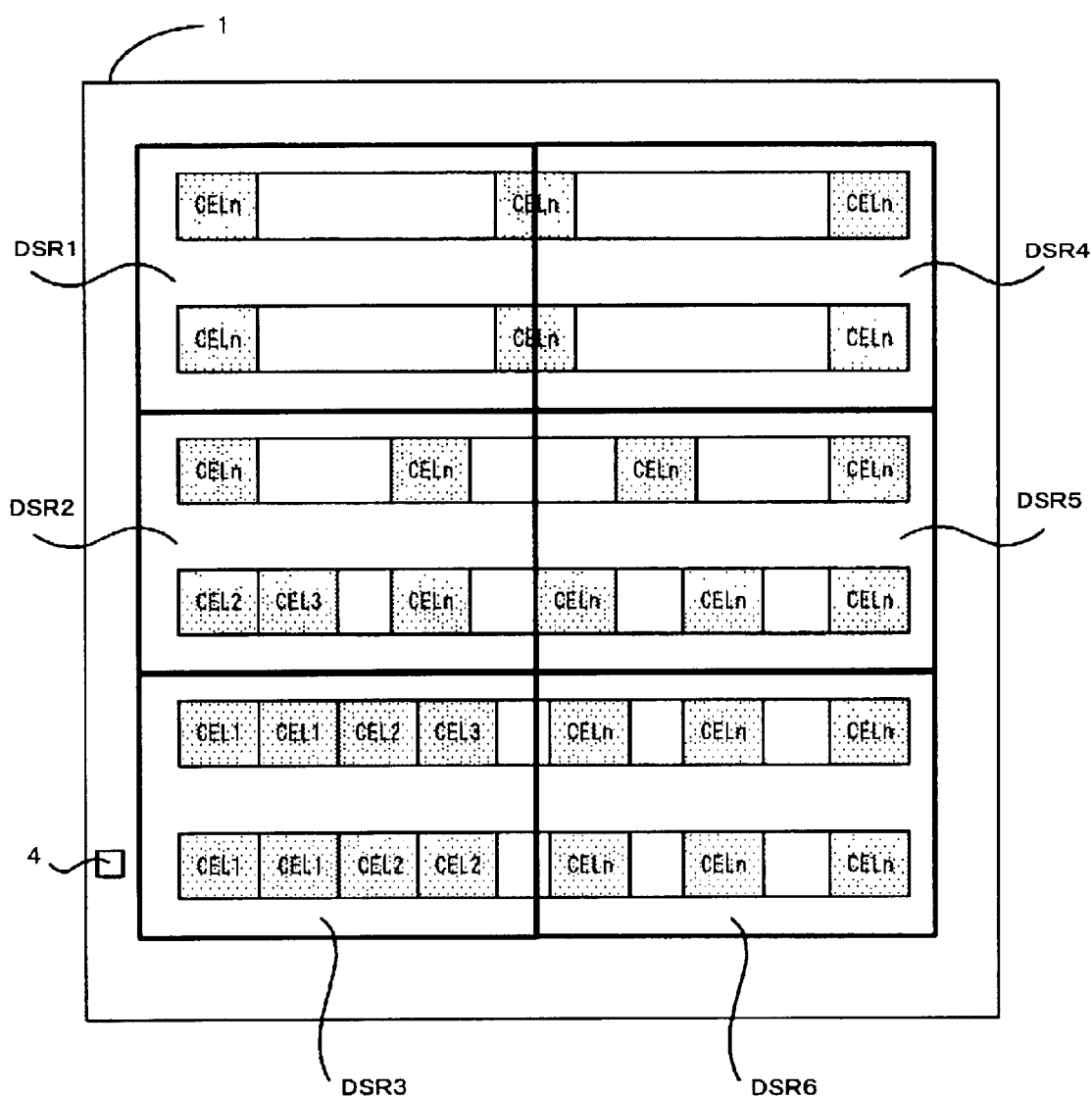
FIG. 2 is a figure to schematically illustrate a layout method for the embodiment of the present invention.
Figure 3:
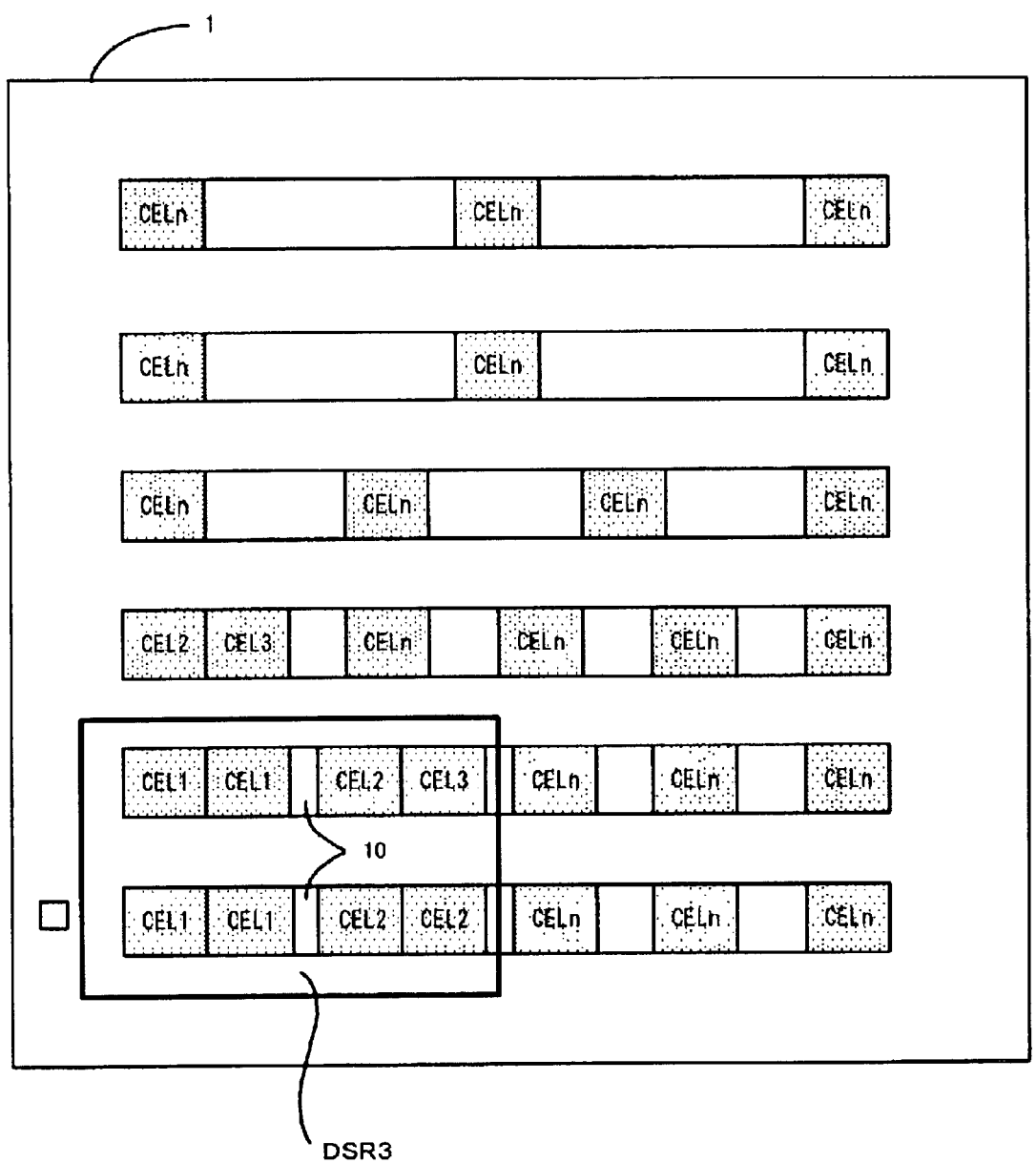
FIG. 3 is a figure to schematically illustrate a layout method for the embodiment of the present invention.

FIGS. 1, 2 and 3 are figures to schematically illustrate a layout method for the embodiment of the present invention. This layout method will be described hereinbelow by referring to these figures. FIG. 1 shows an example of cell arrangement resulting from automated cell arrangement processing for which timing conditions is provided to a netlist resulting from a logic design. The LSI of FIG. 1 is shown as a typical ASIC made using standard cells, for which a plurality of cell arrays 2 and channel regions 3 therebetween are arranged alternately on a chip 1. A plurality of cells are suitably arranged in the cell arrays 2, these cells having, for example, a common size in a vertical direction and a size in a horizontal direction that differs according to the cell.

Supposing that the LSI has a mixture of cells CEL1, CEL2, CEL3, which conform to strict timing for the input of clocks inputted from a clock input terminal 4, and other cells CELn, for which there are no timing conditions. The clock input timing conditions strictly follow the sequential order of cells CEL1, CEL2, CEL3 (for a faster supply).

When automated arrangement processing is performed for a plurality of cells on a chip, in which the above-mentioned timing conditions are prioritized, first cells CEL1 are arranged in immediate proximity to the clock input terminal 4, second cells CEL2 are arranged outside these cells, and third cells CEL3 are arranged outside these cells, as shown in FIG. 1. Further, these cells are arranged so as to neighbor one another without a gap being formed therebetween. Further, other cells CELn, for which there are no timing conditions or whose timing conditions are relaxed, are arranged so as to ensure a fixed gap therebetween over the remaining portion of the cell array. As a result, in a region 5 that is within a fixed distance from the clock input terminal 4, the cell congestion rate is high, and this is accompanied by a wiring congestion rate that is also high.

When detailed wiring processing is performed on a chip on which cells are arranged as shown in FIG. 1, it is impossible to form detailed wiring in the region 5 in which the congestion rate is high, and a situation in which wiring becomes impossible is to be anticipated.

FIG. 2 shows small regions DSR1 to DSR6 produced by virtual division of the chip. In FIG. 2, for the sake of simplicity, the chip 1 is divided into six small regions. However, in actuality, it is desirable that the chip should be divided into a greater number of small regions. According to the layout method of this embodiment, the wiring congestion rate is analyzed for each divided small region DSR. Connection wiring is formed by means of global wiring processing to schematically form wiring between cells arranged automatically, and, in accordance with this global wiring, the wiring congestion rate is calculated for each small region. The method for calculating this congestion rate will be described hereinbelow.

In the event that the wiring congestion rate in a small region exceeds a given reference level, cell rearrangement processing is performed in this small region. A variety of techniques may be considered, but more preferably, cell rearrangement processing includes the steps of: (1) enlarging cell gaps, (2) enlarging cell row gaps, (3) shifting neighboring cells in an upward or downward direction, a leftward or rightward direction, an oblique direction or a rotational direction, (4) changing or inverting the orientation of cells, and (5) substituting with cells having the same logic characteristics and different terminal positions. In this cell rearrangement processing, since a variation in the arrangement of cells takes place while maintaining the relative positional relationship between cells (topological relationship), a cell arrangement state, for which timing conditions have been prioritized, is maintained. Alternatively, since there is only a slight variation in cell positions, a state, according to which timing is optimized, is maintained. This cell rearrangement processing is described hereinbelow.

When it is detected that the wiring congestion rate in a small region DSR3, which is equivalent to the region 5 shown in FIG. 1, is higher than a given reference level, cell rearrangement processing is performed in the small region DSR3 as shown in FIG. 3. In the example of FIG. 3, rearrangement processing is performed in the lowermost cell array and the second cell array to newly provide gaps 10 between neighboring first cells CELL and second cells CEL2. By means of this rearrangement processing, the wiring congestion rate in the small region DSR3 is alleviated, and therefore, in the subsequent detailed wiring processing, the probability of wiring being impossible is lowered.

Figure 4:
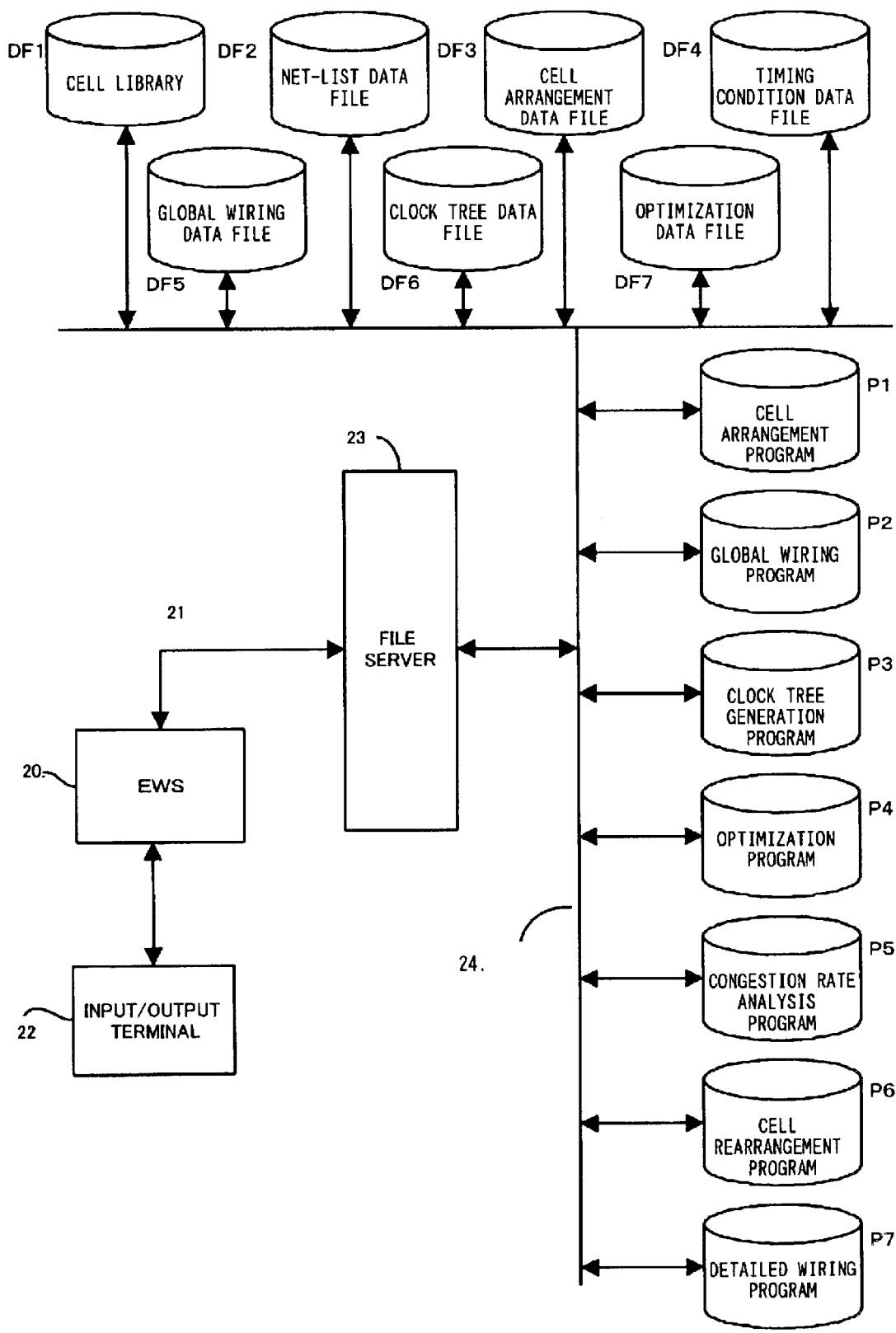
FIG. 4 is a constitutional view of a layout device according to this embodiment.
Figure 5:
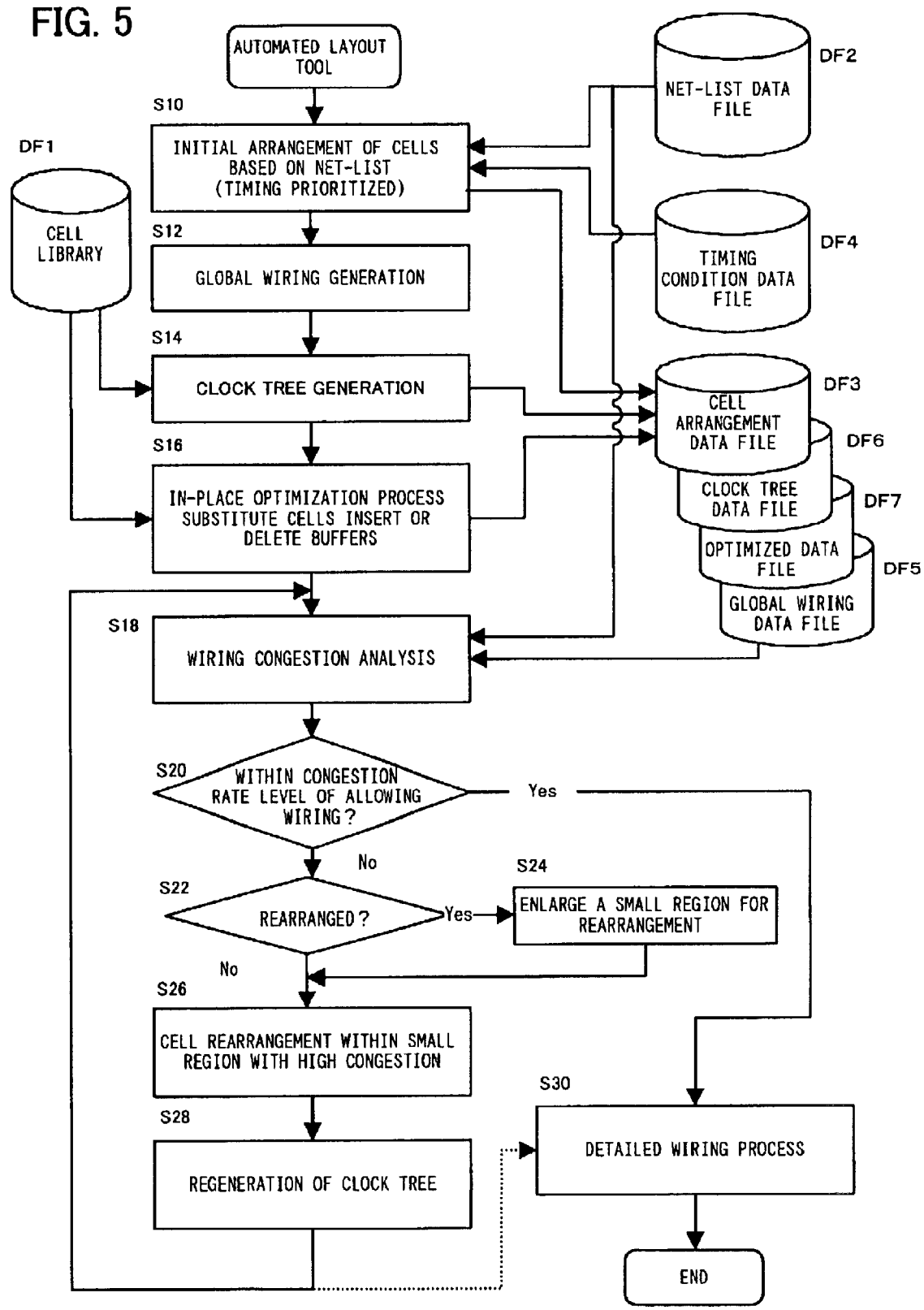
FIG. 5 is a flow chart for a layout method according to this embodiment.

FIG. 4 is a constitutional view of a layout system according to this embodiment, and FIG. 5 is a flow chart for the layout method used thereby. The layout system shown in FIG. 4 has an arithmetic unit 20, which is an engineering workstation, an input/output terminal device 22, and a file server 23, which is connected to the arithmetic unit 20 via a network 21. A plurality of data files DF1 to DF7 and programs P1 to P7 are stored in the file server 23.

The data files include a cell library DF1 in which a plurality of cells are stored beforehand, a netlist data file DF2, which has data for a plurality of cells and connections therebetween generated according to a given logic design, a timing conditions data file DF4, which has timing conditions for predetermined cells in the netlist, and a cell arrangement data file DF3, which has arrangement (positional) data for cells arranged by a cell arrangement program P1. The data files further include a global wiring data file DF5, which contains schematic wiring data formed by means of a global wiring program P2 for arranged cells, a clock tree data file DF6, which is generated by means of a clock tree generation program P3, and an optimization data file DF7, which is generated by means of an optimization program P4. Of the data files mentioned above, the data files DF1, DF2, DF4 are generated prior to the layout step, and data files other than these files are generated by means of the main layout device.

Programs of the layout system, other than the programs mentioned above, include a congestion rate analysis program P5 for calculating the wiring congestion rate on a chip to analyze whether or not the reference level has been exceeded, and a cell rearrangement program P6 for performing cell rearrangement in small areas in which the congestion rate exceeds the reference level. By means of these two programs, it is possible to make the probability small of a situation resulting in which wiring is impossible in detailed wiring processing. In addition, programs of the layout system include a detailed wiring program P7 for the automated generation of connection wiring for a plurality of cells which have been arranged automatically and for which timing has been optimized. Points of difference between the global wiring program and the detailed wiring program will be described hereinbelow.

Next, the layout method will be described in accordance with the flow chart for the layout method in FIG. 5. The layout step, for arranging cells on a chip and generating connection wiring between these cells, is performed after the design of a logic circuit that is to realize the target functions of an LSI. At the stage where the logic design is complete, the netlist DF2 is generated which has cells and connection data therefor.

In the layout step, initial arrangement of cells on the chip is first performed in accordance with a netlist (S10). This cell arrangement processing involves an automated arrangement of cells in which timing conditions for input signals and clocks are prioritized in consideration of the high speed characteristic of LSIs. By arranging cells such that timing conditions are prioritized, it is possible to lower the probability of a fail resulting in the course of a subsequent logic simulation. Therefore, an operator generates a timing conditions data file DF4 for cells for which there are strict timing restrictions on input signals and clocks, and this timing conditions data file DF4 indicates what kind of timing conditions there are for which signals or clocks. Consequently, cell arrangement processing S10 is performed in accordance with the netlist DF2 and the timing conditions data file DF4, and the cell arrangement data file DF3 is thus generated, which has cell arrangement data (positional data) resulting from this cell arrangement processing. This automated cell arrangement results in the generation of a cell arrangement as a result of which there is a concentration of cells in one section, as shown in FIG. 1.

Next, the layout system performs global wiring processing by referencing the netlist DF2 and the cell arrangement data file DF3 (S12). The global wiring processing S12 is processing that generates connection wiring between the input/output terminals and plurality of cells of the chip, while allowing some short circuits. Since conditions for connection wiring are relaxed, global wiring processing S12 can be carried out in relatively short computer processing times. On the other hand, the detailed wiring processing S30 which follows involves the generation of connection wiring between the input/output terminals and plurality of cells of the chip while short circuits are completely denied. As a result, detailed wiring processing is processing that requires relatively long computer processing times as described above.

FIG. 6 is a flow chart for the detailed wiring program. The detailed wiring processing detects the shortest wiring route on the grid, on which wiring can be formed, between two pins (connection terminals) that are to connect input/output terminals and cells (S40). Thereafter, a check is performed as to whether or not the wiring thus detected overlaps wiring that has already been generated on the grid (S42). In a case in which the wiring thus detected overlaps existing wiring, since such an overlap causes a wiring short circuit, a different wiring route is detected (S44). Then, a check is performed as to whether or not the newly detected wiring overlaps existing wiring (S42). Therefore, until it can be confirmed that detected wiring does not overlap existing wiring, the processing S42 and the processing S44 are repeated. When wiring routes for all the connections have been completed by the processing above (S46), the detailed wiring processing is complete.

As a result, in the detailed wiring processing, there is a requirement to generate all wiring without short circuits by means of a wiring route detection algorithm, meaning that relatively long computer processing times are required.

On the other hand, in comparison with detailed wiring processing, which involves a condition according to which the formation of short circuits with existing wiring is denied, global wiring processing (schematic wiring processing) can be performed in relatively short computer processing times.

FIG. 7 shows flow charts for global wiring programs. Two different flow charts A and B are shown in FIG. 7. The flow charts shown here differ from the flow chart for a detailed wiring program in FIG. 6 only with respect to step numbers S42G and S44G. In other words, according to flow chart A, detected wiring is allowed to overlap existing wiring once in step S42G. Therefore, wiring formed on the grid is allowed to overlap to form two layers, but overlapping to form three layers is denied. Since conditions for wiring short circuits are relaxed in this manner, the computer processing time required to generate wiring on the chip is shorter than in the case of the detailed wiring program.

According to the flow chart B, in a case in which the shortest wiring route on the grid between two pins initially overlaps existing wiring, a different wiring route is detected (S44). Without performing a further check for an overlap with existing wiring, this different wiring route is then adopted unconditionally (S44G in the figure). Consequently, since, here also, a plurality of wires are allowed to overlap on the grid, the computer processing time required for the generation of wiring is shorter than in the case of the detailed wiring program.

The flow charts mentioned above schematically illustrate a wiring route search algorithm. Described in more detail, therefore, a wiring route is typically constituted by a horizontally oriented wire, a vertically oriented wire, and a via hole connecting these wires, for example, and an algorithm may be considered that departs from one connection terminal, initially detects a vertically oriented wire, then detects, via a via hole, the next horizontally oriented wire, and, in the event that this wiring forms a short circuit with existing wiring, detects a wire of another orientation to avoid this short circuit, for example, before reaching the other connection terminal. In this case also, by allowing a certain degree of overlap with existing wiring as described above, it is possible to complete global wiring processing in a short time. Since such a wiring route search algorithm is already known by those skilled in the art from a wiring route search tool incorporated in "Silicon Ensemble" by the company "Cadence Inc.", for example, a detailed description of such an algorithm is omitted here.

Referring back to FIG. 5, schematic wiring is generated, between cells arranged on the chip, by means of global wiring processing. The results are recorded as a global wiring data file DF5. The global wiring partially contains wiring short circuits. However, the global wiring may be used adequately in the subsequent timing optimization processing and wiring congestion rate analysis.

Thereafter, clock tree generation processing is performed (S14). A clock tree is clock supply wiring constituted such that, in a case in which a given clock is supplied in parallel to a plurality of cells, a clock can be supplied with the same timing to the plurality of cells. Clock supply wiring in such a case is typically in the shape of a tree, and, in order to make the supply timing uniform, a buffer or similar is incorporated in the clock supply wiring in order to equalize the propagation delay times.

Figure 8A:
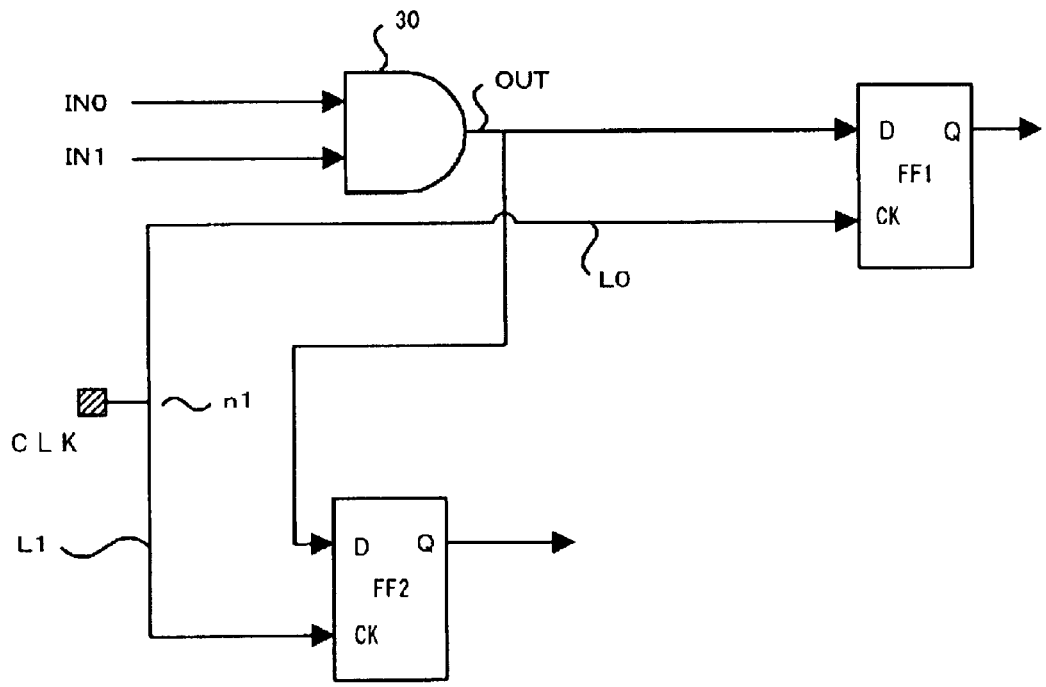
FIG. 8 is a circuit diagram to show examples of clock tree generation.

FIG. 8 is a circuit diagram that shows an example of clock tree generation. The circuit diagram shown in FIG. 8A comprises an AND gate 30 with two inputs INO, IN1; and two flip flops FF1, FF2, to which the output OUT of the AND gate 30 is supplied respectively as a data input, and a common clock CLK is supplied respectively via clock supply wirings L0, L1 to the respective clock terminal of the two flip flops. The clock supply wiring branches off from the clock input terminal via a junction n1 to split into two wires L0, L1 so as to connect to the clock terminals of the respective flip flops. In other words, the clock supply wiring is in a tree shape.

When a circuit of this kind is employed, the output OUT of the AND gate is supplied to the data terminal D of two flip flops with substantially the same timing, meaning that the input timing of the clock CLK to each of these clock terminals CK must be made uniform so as to have substantially the same timing. However, since the distance of the wiring L0 from the branch node n1 is longer in comparison with the wiring L1, the clock signal propagation time becomes longer, with the result that a dock skew is produced between the two flip flops FF0, FF1. This in turn generates a risk of a malfunction occurring.

Figure 8B:
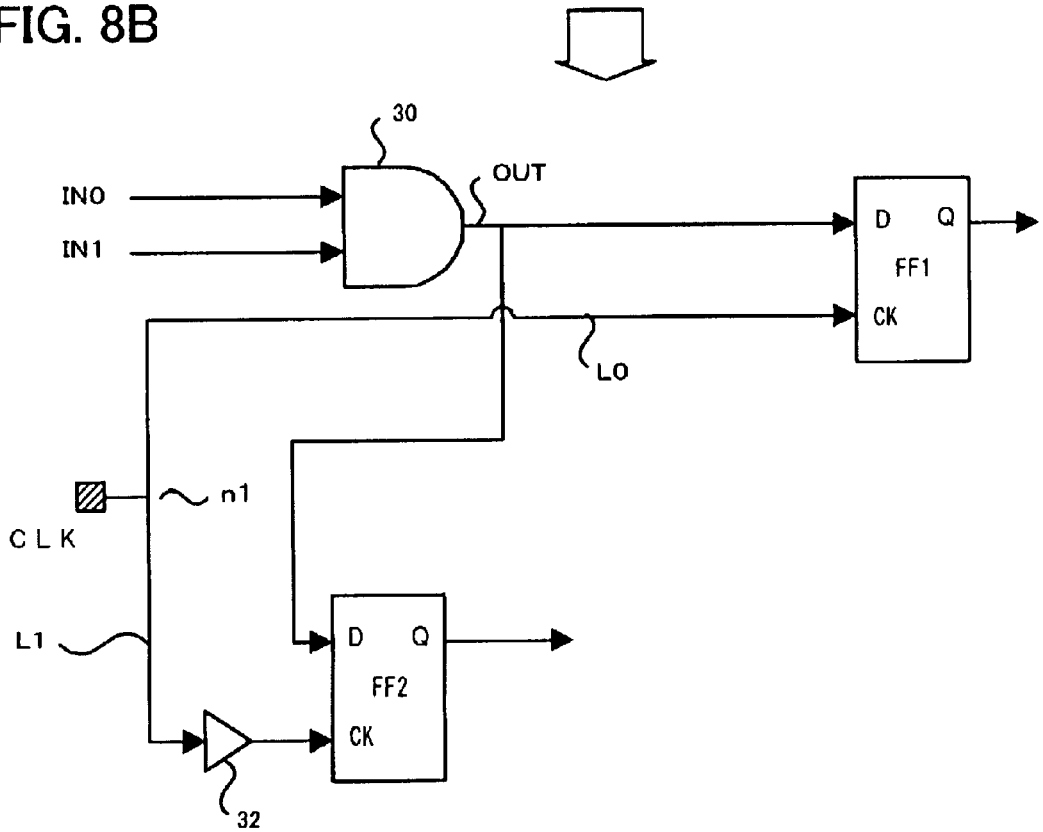

Therefore, in clock tree generation processing, a buffer 32 is incorporated in the second clock supply wiring L1 in order to make uniform the timing of the clock inputs to the two flip flops FF1, FF2, as shown in FIG. 8B. In other words, in clock tree generation processing, once cell arrangement, in which timing is prioritized, has been performed by means of the cell arrangement processing S10, clock timing optimization is performed for this cell arrangement. As a result of the clock tree generation processing, a clock tree data file DF6 is generated.

Thereafter, as shown in FIG. 5, in-place optimization processing is performed (S16). This optimization processing is intended to optimize the signal propagation times for a plurality of cells in whose timing was prioritized, by substitution of cells driving the wiring with cells of a different drive capability, substitution with cells of a different cell delay time, or substitution with cells of a different cell input capacity, or the incorporation or elimination of a buffer in the wiring, in order to optimize the timing of signals between cells.

FIG. 9 is a figure that shows an example of in-place optimization processing. According to the circuit example in FIG. 9A, the output OUT, of the AND gate 30 with two inputs, is supplied to the two flip flops FF1, FF2 and to other circuits which are not illustrated. Here, as a result of the cell arrangement, in comparison with the wiring L10 between the AND gate 30 and the flip flop FF1, the wiring Ll1 to the flip flop FF2 is quite longer, and wiring L12, L13, L14 to the non-illustrated circuits is also longer.

In this case, firstly, the drive load of wiring L10 to L14 is large with respect to the drive capability of the AND gate 30, meaning that the drive capability of the AND gate 30 proves to be insufficient, and the signal propagation time of the wiring L10 proves to be too short in comparison with the other wiring L11 to L14.

Therefore, as shown in FIG. 9B, by means of optimization processing with the cells in an arranged condition (in-place condition), firstly, the AND gate is substituted with an AND gate 30×of larger drive capability in order to resolve the problem of insufficient drive capability. Secondly, a buffer 34 is incorporated in the short wiring L10 in order to lengthen the propagation time thereof, whereby the signal propagation times of the plurality of wiring L10 to L14 are made uniform. In other words, correction, which accompanies cell arrangement and which was not identified at the logic circuit design stage, is performed by means of this optimization processing. As a result of the in-place optimization processing, an optimization data file DF7 is generated.

As a result of the clock tree generation processing S14 and the in-place optimization processing S16 described above, a new buffer is generated and cell substitution is performed. Therefore, global wiring generation processing is respectively performed after these processings.

Thereafter, wiring congestion rate analysis processing is performed (S18). This wiring congestion rate analysis processing is new processing which is not conducted by conventional layout tools. According to this embodiment, after cell arrangement and corresponding optimization processing, and before carrying out detailed wiring processing, an analysis of the wiring congestion rate is performed in order to predict the probability of wiring being impossible in the course of detailed wiring processing.

In the course of the wiring congestion rate analysis, the chip is divided into a plurality of small regions, and the congestion rate in each of these small regions is sought. The division of the chip into this plurality of small regions is as shown in FIG. 2. A variety of ideas exist for the determination of the wiring congestion rate. For example, consideration may be given to: (1) the cell surface area density, which is determined by dividing the cell surface areas of a small region by the surface area of the small region; (2) the connection pin density, which is determined by dividing the number of cell connection pins of a small region by the surface area of the small region; (3) the wiring occupancy which is determined by dividing the total number of wires of a small region (of horizontal or vertical orientation) by the grid count; (4) the number of wires passing through a small region; and (5) a value determined by dividing the total number of wires in a small region by the total number of connection pins.

The cell surface area density of (1) and the connection pin density of (2) mentioned above indirectly indicate the wiring congestion rate and can be determined by means of a simple calculation. Further, the wiring occupancy of (3) relates to a more direct wiring congestion rate but does not necessarily represent a direct expression of the congestion rate on account of being based on the wiring generated by global wiring. A criterion exists for the wiring congestion rate such that when the number of through wires of (4) is high, wiring of the cells of the small region becomes difficult. In addition, the value of (5) is the number of wires for every connection pin, and a criterion exists for the wiring congestion rate such that, when there is a large fan-out number with respect to the output pins, for example, and a large number of through wires, wiring becomes difficult.

Figure 10A:
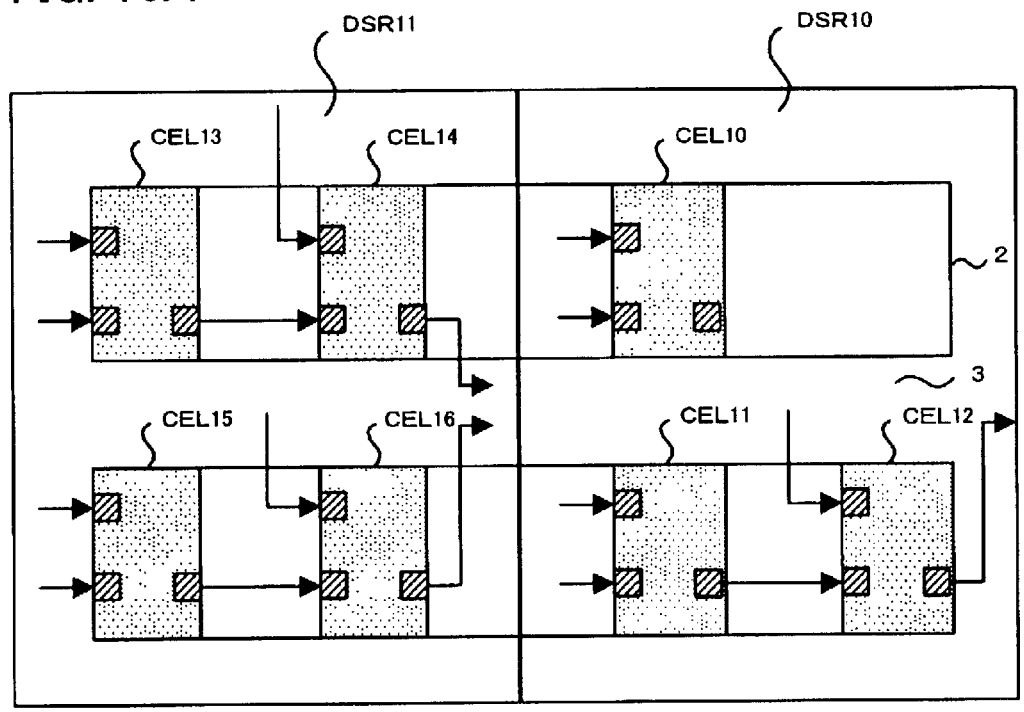
FIG. 10 is a figure to illustrate wiring congestion rates.
Figure 10B:
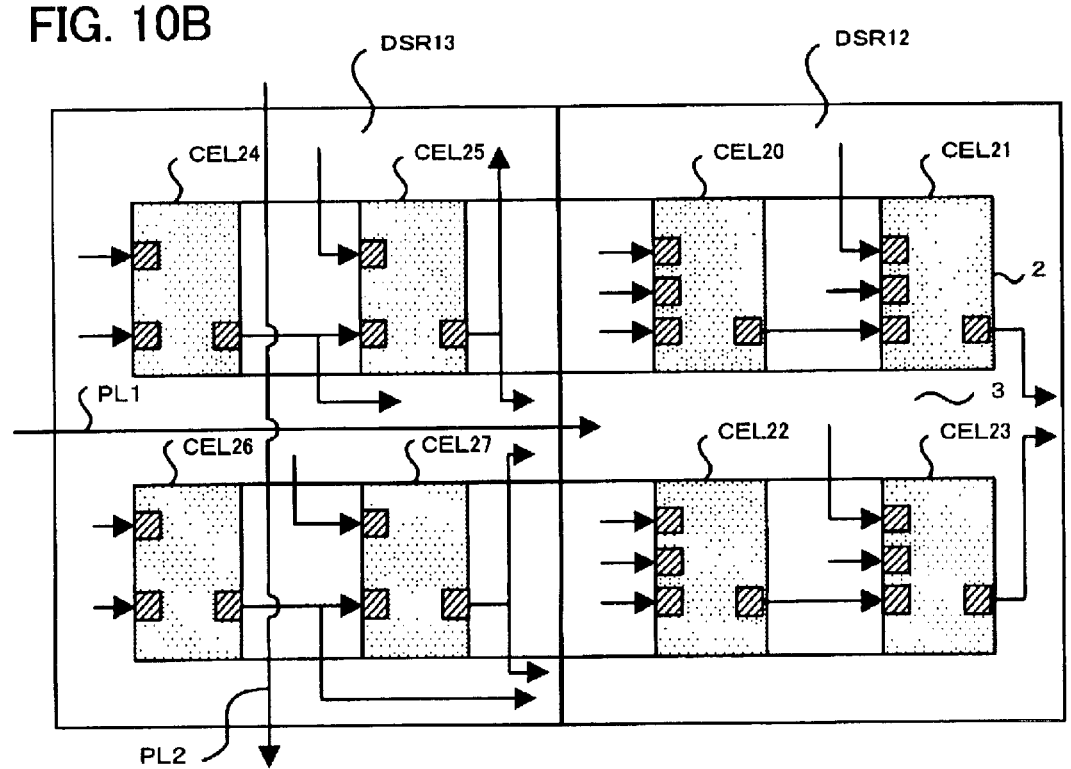

FIG. 10 is a figure to illustrate wiring congestion rates. For the purposes of a comparison, an example of a cell layout with a low wiring congestion rate is shown in FIG. 10A and an example of a cell layout with a high wiring congestion rate is shown in FIG. 10B. In the cell layout example of FIG. 10A, cells CEL10 to CEL12 and CEL13 to CEL16 are respectively arranged in two small regions DSR10 and DSR11. Meanwhile, in the cell layout example of FIG. 10B cells CEL20 to CEL23 and CEL24 to CEL27 are respectively arranged in two small regions DSR12 and DSR13.

When the small regions DSR10 and DSR12 are compared, only three cells are arranged in the small region DSR10, and each of these cells has only two input terminals on the left boundary thereof and one output terminal on the right boundary thereof. On the other hand, there are four cells arranged in the small region DSR12, and each of these cells has three input terminals on the left boundary thereof and one output terminal on the right boundary thereof. As a result, among the above-mentioned wiring congestion rates, if the congestion density in relation to (1) the cell surface area density and (2) the connection pin density is considered, the wiring congestion rate is higher in the small region DSR12 than in DSR10.

Next, when the small regions DSR11 and DSR13 are compared, for the cells CEL13 to CEL16 in the small region DSR11, the fan-out number of all the output terminals of these cells is "1", and there are no wires passing through this small region DSR11. On the other hand, for the cells CEL24 to CEL27 in the small region DSR13, the fan-out number of all the outputs is "2", and the wires PL1, PL2 are present that pass through this small region.

Therefore, as far as both small regions DSR11, 13 are concerned, (1) the cell surface area density and (2) the connection pin density mentioned above are the same. However, as far as (4) the number of through wires and (5) the number of wires for every connection pin are concerned, the wiring congestion rate is at a higher level in the small region DSR13. As a result, even if the same number of cells and connection pins are contained in a small region, if the fan-out number of the output pins is high and the through wires from outside are numerous, the wiring congestion rate is high and there is therefore a possibility that wiring will be impossible in the course of detailed wiring processing.

Values other than those mentioned above exist in relation to the wiring congestion rate, and can be used appropriately. In the course of the wiring congestion rate analysis processing S18, a value in relation to this congestion rate is determined for each small region in accordance with the netlist DF2, the cell arrangement data DF3, the clock tree data DF6, the optimization data DF7, and the global wiring DF5, and a congestion rate map is expressed and output according to a given reference level. For example, it is indicated that congestion of the small region DSR3 is large as shown in FIG. 2, and it is therefore indicated that this small region is to be subjected to cell rearrangement.

In a case in which the congestion rate in question exceeds a level of permitting wiring (S20), cell rearrangement processing is performed in small regions for which the congestion rate is high (S26). Firstly, this cell rearrangement processing permits, on account of being performed only in small regions, the timing optimization state of the cells of the entire chip to be better maintained in comparison with cell rearrangement processing for the entire chip. Secondly, by placing a restriction on the cell rearrangement in the small regions such that this system must perform rearrangement while maintaining the positional relationship between cells, it is possible to maintain, and indeed better maintain as-is, the timing optimization state of the cells in the small regions. The cell rearrangement processing will be described hereinbelow.

Once cell rearrangement has been performed in only small regions for which the congestion rate is high, clock tree generation processing is performed once again (S28). By varying given cell positions, important clock trees can be re-optimized by timing optimization. Next, a judgement is made again as to whether or not the congestion rate permits wiring (S20), and if it is judged that wiring is possible, detailed wiring processing S30 follows.

According to another preferred embodiment, as shown with a dotted line in FIG. 5, detailed wiring processing S30 may be performed after cell rearrangement without judging again whether or not the congestion rate permits wiring. In this case, since cell rearrangement is performed at least in small regions in which wiring appears to be impossible, the probability of wiring being impossible in the course of detailed wiring processing is lower than with conventional methods. Consequently, the probability of initial arrangement processing and detailed arrangement processing of cells being repeated as in a conventional example, is thus reduced.

According to another preferred embodiment, in a case in which after cell rearrangement has been carried out, it is judged again that the congestion rate is not at a level permitting wiring, the small regions to be subjected to rearrangement are enlarged to perform cell rearrangement processing once again (S22, S24). By enlarging regions, which are to be subjected to rearrangement processing, rearrangement processing may be performed with a higher degree of freedom, meaning that it is possible to alleviate the wiring congestion rate in small regions.

Figure 11A:
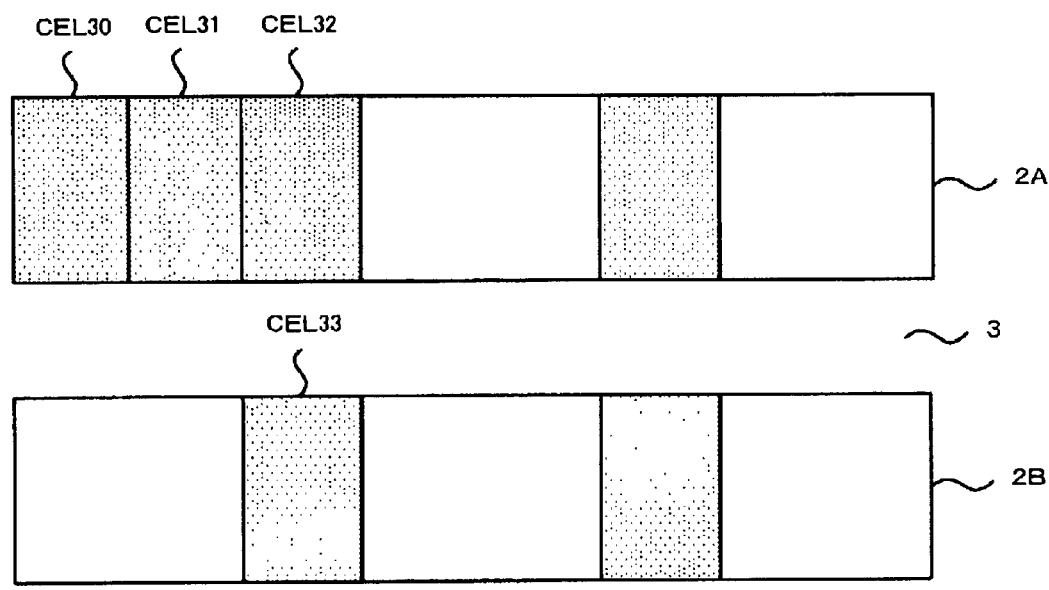
FIG. 11 is a figure to illustrate a method of enlarging gaps between neighboring cells in a cell row, in cell rearrangement.

Next, cell rearrangement processing will be described. FIG. 11 and FIG. 12 are figures to illustrate a method used in this cell rearrangement for enlarging the gaps between neighboring cells in a cell row. In FIG. 11A, three cells CEL30 to CEL32 are arranged in a cell row 2A, and a cell CEL33 in proximity with these cells is arranged in another cell row 2B.

Figure 11B:
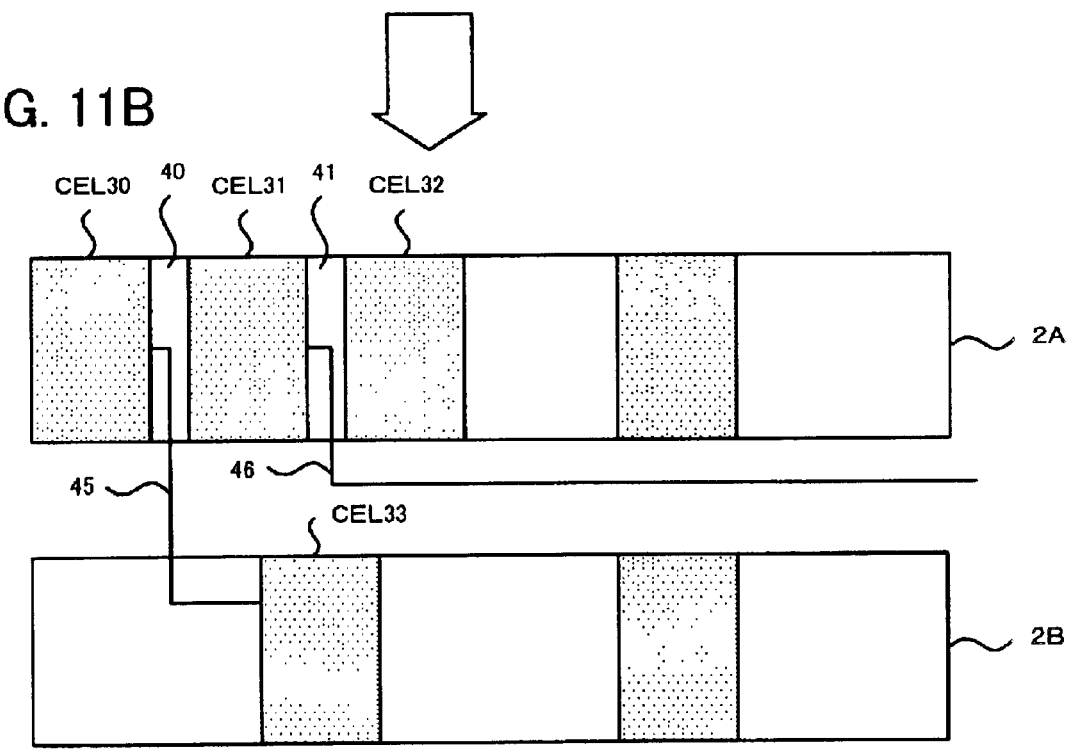

In this case, as shown in FIG. 11B, gaps 40, 41 are provided between the three neighboring cells CEL30 to CEL32 in the cell row 2A such that wires 45, 46 can be formed so as to pass through these gaps. Cell rearrangement processing of this kind involves only performing processing in which small gaps 40, 41 are provided while the relative positional relationship of the cells CEL30 to CEL32 is maintained. By means of this kind of rearrangement, it is therefore possible to maintain the state in which the cell timing is optimized.

Figure 12A:
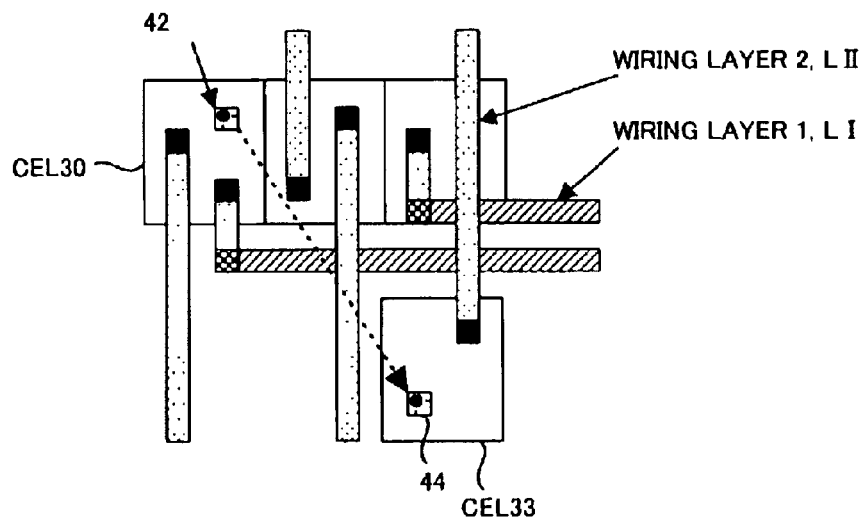
FIG. 12 is a figure to illustrate a method of enlarging gaps between neighboring cells in a cell row, in cell rearrangement.

FIG. 12 illustrates the above description in more concrete terms. In this example, as illustrated in FIG. 12A, there are three terminals in the cell CEL30, and, supposing that there is a requirement to connect one terminal 42 of CEL30 to a terminal 44 of the cell CEL33, there is thus a requirement to form wiring in the direction shown by the dotted line in the figure. This wiring is constituted by a horizontally oriented first wiring layer L1 and a vertically oriented second wiring layer L11. However, since there is no grid, in the cell CEL30, permitting wiring in the direction of the cell CEL33 in the vertically oriented second wiring layer L11, it is not possible to form a connection between the terminals 42, 44.

Figure 12B:
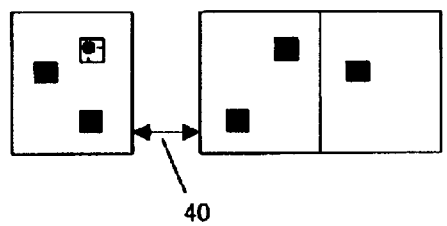
Figure 12C:
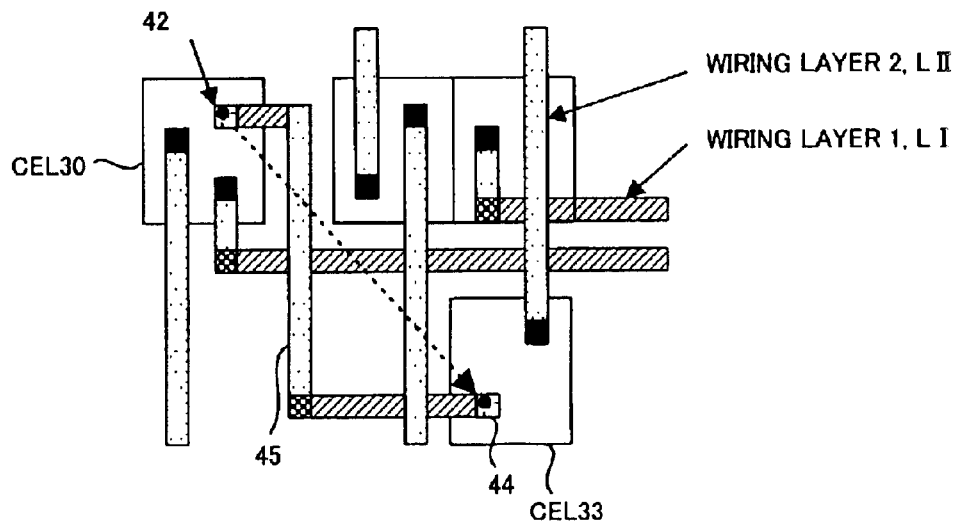

Therefore, by formation of the cell gap 40 as shown in FIG. 12B, a grid that permits wiring to pass therethrough is newly added, whereby, as shown in FIG. 12C, it is possible to form wiring 45 of a second layer to form a connection between the terminals 42, 44. Therefore, through the provision of a cell gap 40, a state in which wiring is impossible changes into a state permitting wiring. Moreover, by the provision of a cell gap, the probability is low of there being any impediment to the state of cell timing optimization.

Figure 13A:
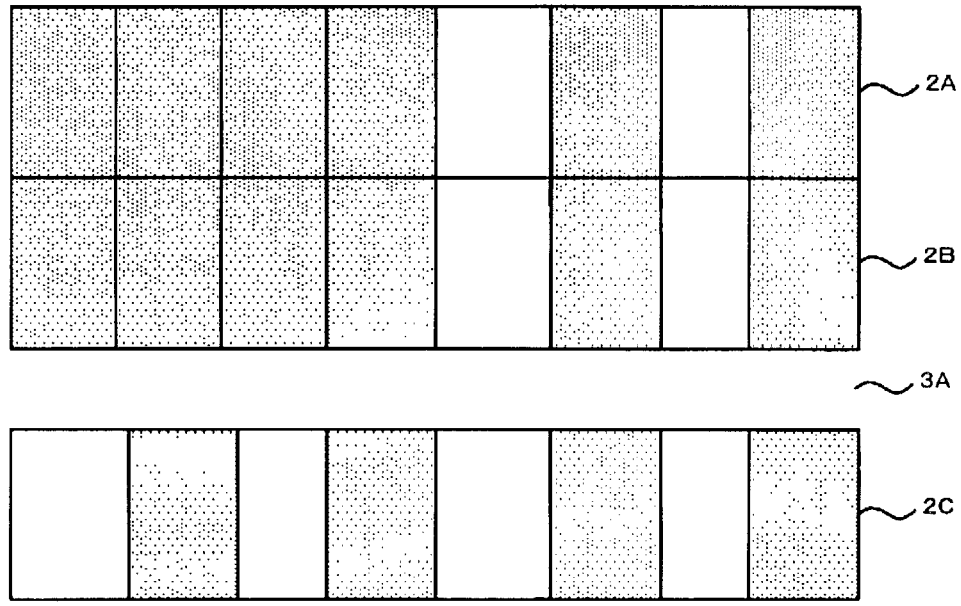
FIG. 13 is a figure to illustrate a method of generating gaps in a cell row, in cell rearrangement.
Figure 13B:
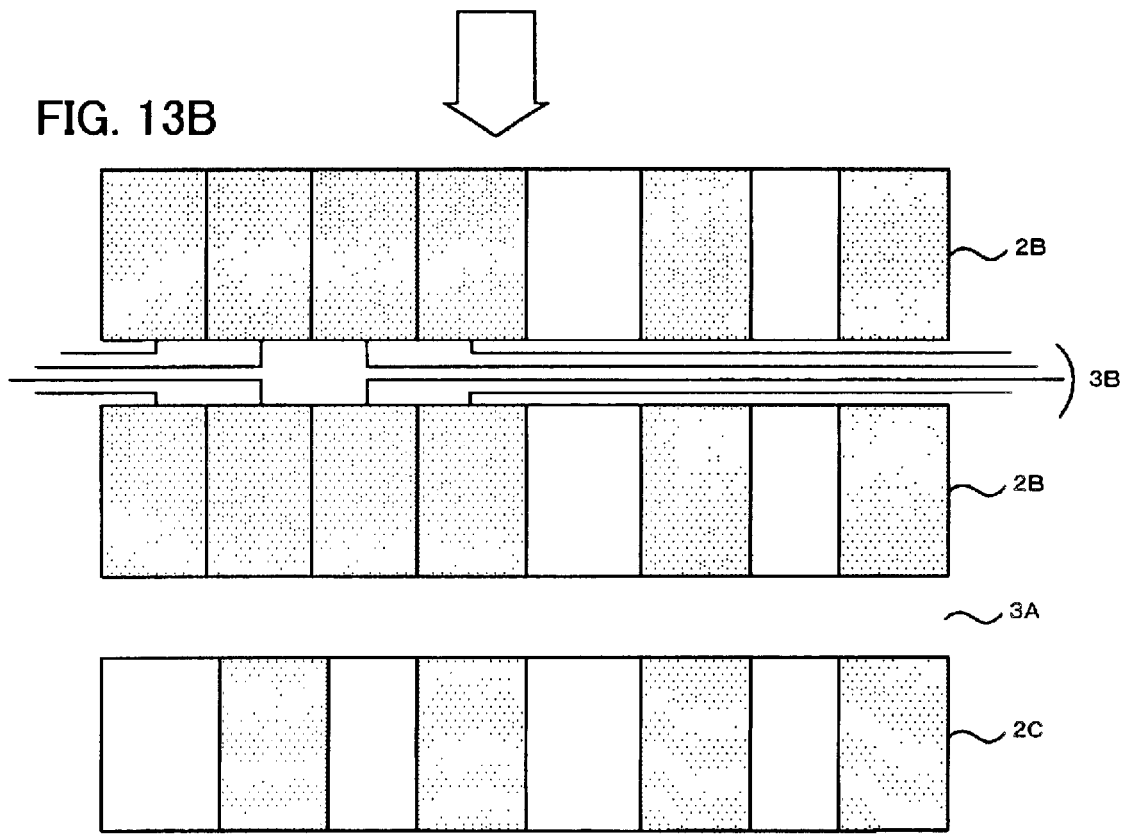

FIG. 13 is a figure to illustrate a method of generating gaps in a cell row, in cell rearrangement. In FIG. 13A shows an example in which there is no channel region between the cell rows 2A, 2B, and there is a channel region 3A between the cell rows 2B, 2C. At the left end of each of the cell rows 2A, 2B, there are four cells arranged in close formation. Further, in cell rearrangement processing with respect to cell arrangement of this kind, as shown in FIG. 13B, a new gap 3B is provided between the cell rows 2A and 2B. As a result, a grid, which permits the formation of wiring, is newly produced in the gap 3B, and it therefore becomes possible to form wiring. In other words, by ensuring that there is a new wiring region, the probability of wiring being impossible in the course of detailed wiring processing is low.

Figure 14A:
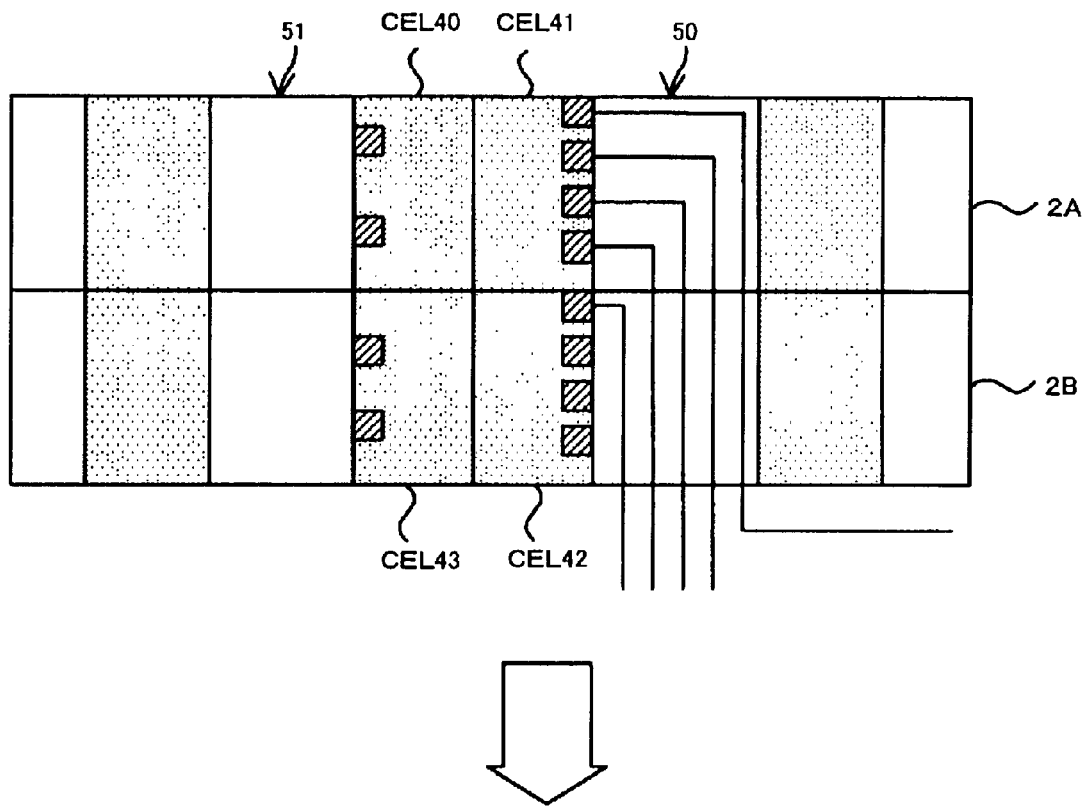
FIG. 14 is a figure to illustrate a method of shifting the position of neighboring cells upward or downward, or to the left or right, in cell rearrangement.

FIG. 14 is a figure to illustrate a method of shifting the position of neighboring cells in an upward or downward direction, a leftward or rightward direction, an oblique direction or a rotational direction, in cell rearrangement. As shown in FIG. 14A, cells CEL40, CEL41, and CEL42, CEL43 are arranged in neighboring cell rows 2A, 2B respectively. Next, on both sides of these groups of four individual cells, wiring regions 50, 51 are ensured. However, the cells CEL40, CEL43 each have only two terminals, whereas the cells CEL41, CEL42 each have four terminals. Consequently, there is a requirement to provide wires to connect a total of eight terminals in the wiring region 50, and, depending on the case, a state may arise in which wiring is impossible.

Figure 14B:
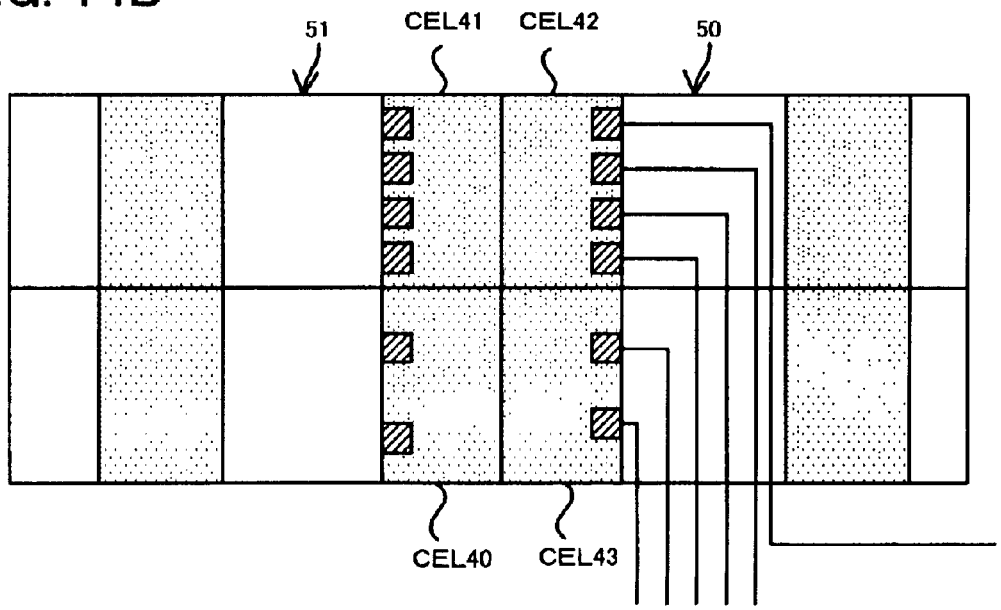

Therefore, as shown in FIG. 14B, by moving the four cells CEL40 to CEL43 in a counterclockwise direction, rearrangement of these cells is such that the cell CEL40 with two terminals and the cell CEL41 with four terminals are juxtaposed with the wiring region 51, and the cell CEL43 with two terminals and the cell CEL42 with four terminals are juxtaposed with the wiring region 50. By rearranging the cells in this manner, the number of wires required in the wiring region 50 is reduced to six, whereby a state in which wiring is impossible can be avoided. Moreover, since the positions of neighboring cells are only shifted, it is possible to maintain the relative positional relationship of cells in whose arrangement timing was prioritized. In other words, since it is possible to maintain all the cells CEL40 to CEL43 in similar positions, even following rearrangement thereof, it is possible to maintain the state in which cell timing is optimized.

In the rearrangement example described above, four cells may also be moved in a clockwise direction, or it is possible to reduce wiring congestion in the same manner also by shifting cells CEL40 and CEL41.

FIG. 15 is a figure to illustrate a method of inverting cell direction in cell rearrangement. In the example of FIG. 15A, cells CEL50 to CEL53 are arranged in a cell row. Further, cells CEL50 to CEL52 each have four terminals, and only cell CEL53 has two terminals. The origins OR1, 2, 3 of cells 51, 52, 53 are all positioned on the left side thereof. As a result, there is a possibility that wiring will be impossible as a result of the close formation of connection pins in the cells CEL51, CEL52.

Therefore, in cell rearrangement, as shown in FIG. 15B, cell rearrangement is such that the orientation of the cell CEL52 is inverted so that the origin DR2 is on the right side. As a result, the positions of the terminals of the cell CEL52 (connection pin positions) are on the right side, whereby it is possible to alleviate the density of the terminals in the cell CEL51, and therefore to reduce the probability of wiring being impossible. Further, since only the orientation of the cell CEL52 is changed, there is no variation in the relative position of the cell, and consequently the state, in which the cell timing is optimized, is maintained.

FIG. 16 is a figure to illustrate a method of substitution with cells that have the same logic circuit and electrical characteristics and whose terminal positions are different. In the example of FIG. 16A, cells CEL60, CEL61 are arranged so as to neighbor one another. Further, the cell CEL60 has two connection terminals positioned at the center of the right boundary thereof, and cell CEL61 has two connection terminals positioned at the center of the left boundary thereof. In other words, the connection terminals are concentrated in the position in which the connection regions 62, 63 are separated. In this condition, there is a possibility of connection wiring being impossible.

Therefore, in cell rearrangement processing, as shown in FIG. 16B, the cells CEL60, CEL61 are substituted with the cells CEL60A, CEL61A, which have the same logic circuit as the cells CEL60 and CEL61, equivalent electrical characteristics such as output drive capability and input/output level, but whose connection terminal positions are different.

These cells CEL60A, CEL61A are cells which are stored in the cell library and which may substitute original cells CEL60 and CEL61. As a result, the connection terminals of both the cells CEL60A, CEL61A are in positions beside connection regions 62, 63, and the concentration of terminals is thus alleviated, meaning that it is possible to lower the probability of wiring being impossible. Moreover, since there is no variation in cell position, the timing optimization state of cells can also be maintained.

Examples of six kinds of cell rearrangement method have been described hereinabove. This rearrangement is, in each case, performed only in small regions in which a high wiring congestion rate is anticipated. Moreover, the relative positional relationship between cells is maintained, or variations in cell position are restricted to minute variations, whereby it is possible to maintain the cell timing optimization state which is generated as a result of cell arrangement in which timing is prioritized (S10), clock tree generation (S14), and in-place optimization processing (S16). Consequently, by means of the cell rearrangement processing described above, initial cell arrangement and subsequent optimization processing are not performed in vain, and it is possible to lower the probability of wiring being impossible in the course of the subsequent detailed wiring processing. Furthermore, since cell rearrangement processing is restricted to small regions in which the congestion rate is high, the overall cell arrangement state can be maintained, and computer processing times are short on account of the fact that the number of cells to be subjected to rearrangement processing is small.

There are also methods, other than those described above, for performing cell rearrangement such that the cell timing state is maintained as-is. Whichever of these methods is used, by maintaining the relative positions between cells or by making variations in cell position only minute, it is possible to maintain the optimized timing state of cells.

The LSI layout method described hereinabove may be performed by means of a computer system which has layout program tools as shown in FIG. 4. Further, each layout program tool is stored on a recording medium.

According to the present invention described hereinabove, as a result of performing automated cell arrangement, in which timing is prioritized, and the corresponding timing optimization processing, and since cell rearrangement processing is carried out in regions for which the wiring congestion rate is high, it is possible to keep the probability low of wiring being impossible in subsequent detailed wiring processing. There is therefore a reduced need to repeat processing involving long computer processing times, namely automated arrangement processing and detailed wiring processing.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A layout method for an LSI having a plurality of cells, comprising:
   performing automated arrangement of cells on a chip on the basis of a netlist, which has a plurality of cells and connection data therefor, and cell timing conditions data;
   generating wiring connecting said cells with alleviating conditions for short circuits between wiring;
   optimizing a timing of the cells in accordance with the signal propagation time of the wiring connecting said automatically arranged cells;
   seeking a congestion rate of said wiring, and detecting regions for which the congestion rate is higher than a reference level;
   performing rearrangement processing of said cells in a small associated region for which the congestion rate is higher than the reference level, said chip being divided into a plurality of small associated regions; and
   generating wiring connecting the cells, after said cell rearrangement processing, such that short circuits between wiring are forbidden,
   wherein, after performing rearrangement processing of the cells in the small associated region for which the congestion rate is higher than the reference level, wiring congestion rate analysis is performed once again, and
   in a case wherein the congestion rate does not exceed the reference level, the generating wiring connecting the cells is performed such that short circuits between wiring are forbidden, and
   wherein, in a case in which there is a region for which the congestion rate exceeds the reference level, a size of said small associated region increased to perform the cell rearrangement processing once again.

2. The LSI layout method according to claim 1, further comprising generating a clock tree with respect to the arranged cells, after said cell arrangement processing and before said cell rearrangement processing.

3. The LSI layout method according to claim 2, wherein the generating the clock tree is executed once again following said cell rearrangement processing.

4. The LSI layout method according to claim 1, wherein performing rearrangement processing includes a processing which enlarges gaps between a plurality of neighboring cells or cell rows.

5. The LSI layout method according to claim 1, wherein the performing rearrangement processing includes a processing which shifts a plurality of neighboring cells in at least one of a leftward or rightward direction, upward or downward direction, an oblique direction, and a rotational direction.

6. The LSI layout method according to claim 1, wherein the performing rearrangement processing includes a processing which inverts the orientation of cells.

7. The LSI layout method according to claim 1, wherein the performing rearrangement processing includes a processing which substitutes cells with different cells whose logic characteristics are the same and whose connection pin positions are different.

8. The LSI layout method according to claim 1, wherein the performing rearrangement processing is performed while maintaining timing relationships of cells.

9. The LSI layout method according to claim 1, wherein the seeking the congestion rate includes determining said congestion rate in accordance with at least one of the total surface area of cells in said small associated regions, the total number of cell connection pins, the total number of connection wires, and the total number of through wires.

10. The layout method according to claim 1,
    wherein the seeking the congestion rate of the wiring includes determining the congestion rate of the wiring includes determining said congestion rate in accordance with a value produced by dividing a total number of connection wires in the small associated regions by a total number of cell connection pins.

11. The LSI layout method according to claim 1, wherein said timing optimization processing involves at least one of:

substitution of cells with different cells which differ with respect to at least one of cell output drive capability, cell delay time, and cell input load capacitance; insertion of a buffer in wiring connecting cells; and elimination of a buffer from wiring connecting cells.

12. An LSI layout system for performing layout of an LSI having a plurality of cells, comprising:
   automated arrangement unit for performing automated arrangement of cells on a chip on the basis of a netlist, which has a plurality of cells and connection data therefor, and cell timing conditions data;
   global wiring processing unit for generating wiring connecting said cells with alleviating conditions for short circuits between wiring;
   timing optimization processing unit for optimizing a timing of the cells in accordance with the signal propagation time of the wiring connecting said automatically arranged cells;
   congestion rate analysis processing unit for seeking a congestion rate of said wiring, and detecting regions for which the congestion rate is higher than a reference level;
   cell rearrangement processing unit for performing rearrangement processing of said cells in small associated regions for which the congestion rate is higher than the reference level, said chip being divided into a plurality of small associated regions; and
   detailed wiring processing unit for generating wiring connecting the cells, after said cell rearrangement processing, such that short circuits between wiring are forbidden,
   wherein, after said cell rearrangement processing by the cell rearrangement processing unit in the small associated region for which the congestion rate is higher than the reference level, wiring congestion rate analysis is performed once again by the congestion rate analysis processing unit, and
   in a case wherein the congestion rate does not exceed the reference level, detailed wiring processing is performed by the detailed wiring processing unit; and
   wherein, in a case in which there is a region for which the congestion rate exceeds the reference level, a size of said small associated region is increased to perform the cell rearrangement processing once again by the cell rearrangement processing unit.

13. The LSI layout system according to claim 12, further comprising a clock tree generation unit for generating a clock tree with respect to the arranged cells, after said cell arrangement processing and before said cell rearrangement processing.

14. The LSI layout system according to claim 13, wherein the clock tree generation is performed once again after said cell rearrangement processing.

15. The LSI layout system according to claim 14, wherein said cell rearrangement processing unit performs the cell rearrangement processing while maintaining timing relationships of cells.

16. An LSI layout program for making a computer perform layout of an LSI having a plurality of cells, comprising:
   an automated cell arrangement program for performing automated arrangement of cells on a chip on the basis of a netlist, which has a plurality of cells and connection data therefor, and cell timing conditions data;
   a global wiring processing program for generating wiring connecting said cells with alleviating conditions for short circuits between wiring;
   a timing optimization processing program for optimizing timing of the cells in accordance with the signal propagation time of the wiring connecting said automatically arranged cells;
   a congestion rate analysis processing program for seeking a congestion rate of said wiring, and detecting regions for which the congestion rate is higher than a reference level;
   a cell rearrangement processing program for performing rearrangement processing of said cells in small associated region for which the congestion rate is higher than the reference level, said chip being divided into a plurality of small associated regions; and
   a detailed wiring processing program, for generating wiring connecting the cells, after said cell rearrangement processing, such that short circuits between wiring are denied,
   wherein, after said cell rearrangement processing in the small associated region for which the congestion rate is higher than the reference level, wiring congestion rate analysis is performed once again, and
   in a case wherein the congestion rate does not exceed the reference level, said detailed wiring processing is performed; and
   wherein, in a case in which there is a region for which the congestion rate exceeds the reference level, a size of said small associated is increased to perform the cell rearrangement processing once again.

17. A wiring congestion minimizing layout method for an LSI having a plurality of cells, wherein a plurality of cells are automatically arranged on a chip on the basis of a netlist having connection data and cell timing conditions data, the cells are divided into a plurality of regions of a predetermined size, and wiring is generated connecting said cells to alleviate conditions for short circuits between wiring and to optimize signal propagation time of the wiring connecting said automatically arranged cells, the method comprising:
   determining a congestion rate of the wiring in each of the plurality of regions and for each region:
      where the congestion rate for a region is less than or equal to the reference level:
         performing detailed wiring processing to eliminate short circuits between wiring; and
      where the congestion rate for the region is greater than the reference level:
         rearranging the cells in the region for which the congestion rate is greater than the reference level;
         determining whether the congestion rate of the region having the rearranged cells is greater than the reference level and, where the congestion rate for the region is greater than the reference level, repeating the following operations until the congestion rate for the region is less than or equal to the reference level:
            enlarging the region to a next predetermined size;
            rearranging the cells in the enlarged region; and
            determining whether the congestion rate of the rearranged cells in
            the enlarged region is greater than the reference level; and
         upon determining that the congestion rate for the region is less than or equal to the reference level, performing detailed wiring processing to eliminate short circuits between wiring.

* * * * *

UNITED STATES PATENT AND TRADEMARK OFFICE
CERTIFICATE OF CORRECTION

PATENT NO. : 6,857,107 B2
DATED : February 15, 2005
INVENTOR(S) : Mitsuaki Nagasaka et al.

It is certified that error appears in the above-identified patent and that said Letters Patent is hereby corrected as shown below:

Column 16,
Line 11, change "region" to -- regions --.
Line 27, insert -- region -- after "associated".

Signed and Sealed this

Twenty-third Day of August, 2005

JON W. DUDAS
*Director of the United States Patent and Trademark Office*